(12) United States Patent
Yoshiba

(10) Patent No.: US 6,253,360 B1
(45) Date of Patent: Jun. 26, 2001

(54) TIMING GENERATOR

(75) Inventor: Kazumichi Yoshiba, Tokyo (JP)

(73) Assignee: Advantest Corporation, Tokyo (JP)

( * ) Notice: Subject to any disclaimer, the term of this patent is extended or adjusted under 35 U.S.C. 154(b) by 0 days.

(21) Appl. No.: 09/269,985

(22) PCT Filed: Aug. 6, 1998

(86) PCT No.: PCT/JP98/03515

§ 371 Date: Apr. 5, 1999

§ 102(e) Date: Apr. 5, 1999

(87) PCT Pub. No.: WO99/08123

PCT Pub. Date: Feb. 18, 1999

(30) Foreign Application Priority Data

Aug. 6, 1997 (JP) .................................................. 9-211834

(51) Int. Cl.⁷ ...................................................... H03L 7/06
(52) U.S. Cl. ...................................................... 716/6; 716/1
(58) Field of Search .......................... 716/6, 5, 1; 703/19; 327/144

(56) References Cited

U.S. PATENT DOCUMENTS 6,173,432 * 1/2001 Harrison .................................. 716/6

FOREIGN PATENT DOCUMENTS

| 06003418 | 1/1994 | (JP) . |
| 08313601 | 11/1996 | (JP) . |
| 09318712 | 12/1997 | (JP) . |
| 10232271 | 9/1998 | (JP) . |
| 10268005 | 10/1998 | (JP) . |

* cited by examiner

Primary Examiner—Tan T. Nguyen
(74) Attorney, Agent, or Firm—Gallagher & Lathrop; David N. Lathrop

(57) ABSTRACT

A timing generator capable of setting data indicating that a timing signal is to be generated in the next cycle, even in the case of generating test pattern signals in multiple way system is provided. In each of clock data processing circuits of N timing generators, N being an integer of 2 or greater than 2, are provided a multiplier for multiplying by N a value of period data read out of period data memory of the associated clock data processing circuit, a subtracter for performing a subtraction between the period data multiplied by N by the multiplier and clock data supplied from a main controller, and means for providing, only in the case that N or more period data are in succession, the period of each of the period data being a constant, a control signal to the associated clock data processing circuit, the control signal enabling a subtraction value outputted from an output terminal of the associated subtracter and a next flag outputted from a carry signal output terminal of the associated subtracter when a value of the clock data is greater than that of the period data multiplied by N to be stored in the memory of the associated clock generator, the next flag representing that a clock is to be generated in the next cycle.

13 Claims, 10 Drawing Sheets

| TIMING SET DATA | PERIOD DATA | CLOCK DATA | CLOCK DATA MEMORY | |
|---|---|---|---|---|
| | | | FLAG | CLOCK DATA |
| TS1 | 100ns | 60ns | SAME | 60ns |
| TS2 | 100ns | 80ns | SAME | 80ns |
| TS3 | 100ns | 320ns | NEXT | 120ns |
| TS4 | 100ns | 240ns | NEXT | 40ns |
| TS5 | 100ns | 180ns | SAME | 180ns |
| TS6 | 100ns | 90ns | SAME | 90ns |

| TIMING SET DATA | PERIOD DATA | CLOCK DATA | CLOCK DATA MEMORY ||
|---|---|---|---|---|
| | | | FLAG | CLOCK DATA |
| TS1 | 200ns | 100ns | SAME | 100ns |
| TS2 | 150ns | 80ns | SAME | 80ns |
| TS3 | 100ns | 130ns | NEXT | 30ns |

| TIMING SET DATA | PERIOD DATA | CLOCK DATA | CLOCK DATA MEMORY | |
|---|---|---|---|---|
| | | | FLAG | CLOCK DATA |
| TS1 | 90ns | 60ns | SAME | 60ns |
| TS2 | 150ns | 80ns | SAME | 80ns |
| TS3 | 100ns | 130ns | SAME | 130ns |

| TIMING SET DATA | CLOCK DATA MEMORY ||
| --- | --- | --- |
| | FLAG | CLOCK DATA |
| TS1 | NEXT | 20ns |
| TS2 | SAME | 80ns |
| TS3 | SAME | 130ns |

| TIMING SET DATA | PERIOD DATA | CLOCK DATA | CLOCK DATA MEMORY | |
| --- | --- | --- | --- | --- |
| | | | FLAG | CLOCK DATA |
| TS1 | 100ns | 230ns | NEXT | 30ns |
| TS2 | 100ns | 150ns | SAME | 150ns |
| TS3 | 100ns | 50ns | SAME | 50ns |

FIG. 14

TIMING GENERATOR

TECHNICAL FIELD

The present invention relates to a timing generator which is suitable for use in a semiconductor device testing apparatus (commonly called IC tester) for testing a semiconductor device such as, for example, a semiconductor integrated circuit (IC), and more particularly, to an improvement in a clock data processing circuit used in the timing generator.

BACKGROUND ART

Heretofore, semiconductor integrated circuits (hereinafter referred to as IC) are classified mainly into two types one of which is called memory ICs in which a memory portion of each of memory ICs is dominant, and the other of which is called logic ICs in which a logic circuit portion (logic portion) of each of logic ICs is dominant. The memory ICs are trending towards an increase in the number of pins (the number of terminals) thereof according to the increased memory capacity in recent years.

Since the testing methods of memory ICs and logic ICs are markedly different from each other, an IC tester for testing memory ICs (a memory testing system) and an IC tester for testing logic ICs (a logic testing system) have been separately constructed, thereby to test memory ICs and logic ICs using those IC testers, respectively.

FIG. 4 is a block diagram showing a general construction of an example of the conventional IC tester for testing a memory IC (the conventional memory testing system). The illustrated IC tester TES comprises a main controller 11, a pattern generator 12, a timing generator 13, a waveform shaping device 14, a waveform generator 15, a logical comparator 18, a group of drivers 16, a group of analog comparators 17, a failure analysis memory 19, and a device power supply PS.

The main controller 11 is generally constructed by a computer system, and mainly controls the pattern generator 12 and the timing generator 13 in accordance with a test program PM created by a user.

Before a testing for ICs is started, various kinds of data are set in the IC tester from the main controller 11. For example, the main controller 11 transfers pattern information to the pattern generator 12 to store the information in a memory for pattern (not shown) provided in the pattern generator 12. In addition, the main controller 11 first transfers period data to the timing generator 13 to store the data in a period data memory provided in a period generator (not shown) which is one of the components for constituting the timing generator 13 as well as in a period data memory provided in a clock data processing circuit (not shown) which is one of the components for constituting the timing generator 13, respectively. Secondly, the main controller 11 transfers clock data to the clock data processing circuit to read out a period data previously set in the period data memory of the clock data processing circuit therefrom thereby performing an arithmetic and logic operation process between the read-out period data and the clock data, the result of the operation process or the transferred clock data being stored in a clock data memory provided in a clock generator (not shown) which is also one of the components for constituting the timing generator 13. The settings of the main data relating to the present invention have substantially completed with this.

In order to sequentially carry out such settings of the various kinds of data from the main controller 11, it is necessary that the period data is set at least in the period data memory of the clock data processing circuit prior to setting of the clock data.

After the various kinds of data have been set, a testing for ICs is started. First, the main controller 11 issues a test start instruction or command to the pattern generator 12. As a result, the pattern generator 12 starts to generate a patter. Accordingly, the time point that the pattern generator 12 starts to generate a pattern becomes the time point of starting a testing. The pattern generator 12 supplies test pattern data PTND to the waveform shaping device 14 and at the same time, supplies timing set information (which is also called timing set data) TS to the period generator and the clock generator of the timing generator 13.

The timing set information means a pair of one information for selecting period data previously set in the period data memory of the period generator and another information for selecting clock data previously set in the clock data memory of the clock generator. As described later in detail, in the period data memory of the period generator are set time intervals of period data corresponding to the numbers of the timing set information (TS1, TS2, TS31, . . . ), usually, in a unit of nanosecond (ns) (for example, TS1 is 90 ns, TS2 is 130 ns , TS3 is 80 ns,) . . . , and similarly, in the clock data memory of the clock generator are set time intervals of period data corresponding to the numbers of the timing set information in a unit of nanosecond (ns) (for example, TS1 is 100 ns, TS2 is 80 ns, TS3 is 30 ns, . . . ). Accordingly, the timing set information means, in this example, information for indicating the number of the timing set information for each of pattern generating cycles such that the first cycle of the pattern generating cycles is TS1, the second cycle of the pattern generating cycles is TS4, the third cycle of the pattern generating cycles is TS2, the fourth cycle of the pattern generating cycles is TS5, . . . . The timing set information is previously programmed by a user.

By application of the timing set information TS to the timing generator 13, the timing generator 13 generates a timing signal (clock pulse) for controlling timings of operation of the waveform shaping device 14, the logical comparator 19 and the like.

The test pattern data PTND is converted to a test pattern signal having a real waveform by the waveform shaping device 14 and the waveform generator 15 located at the succeeding stage of the waveform shaping device 14. The waveform shaping device 14 and the waveform generator 15 are to be described later in detail. The converted test pattern signal is applied to an IC under test (commonly called DUT) 20 through a group of the drivers 16 to store it in the memory of the IC under test 20.

On the other hand, a response signal read out of the IC under test 20 is compared in a group of the analog comparators 17 with a reference voltage from a comparison reference voltage source (not shown) to determine whether or not the response signal has a predetermined logical level (a voltage of H logical level (high logical level), or a voltage of L logical level (low logical level)). A response signal which is determined to have the predetermined logical level is sent to the logical comparator 18 where the response signal is compared with an expected value data outputted from the pattern generator 12. When the response signal does not coincide with the expected value data, the memory cell of the IC under test 20 at the address thereof from which the response signal is read out is determined to be defective or a failure, and the address of the failure memory cell is stored, each time a failure occurs, in the failure analysis memory 19 as a failure address. Usually, the address of a failure memory cell is stored in a memory cell of the failure analysis memory 19 having the same address as that of the IC under test 20. At the time of completion of the test, the failure addresses stored in the failure analysis memory 19 are read out thereof to determine, for example, whether the failure memory cell or cells of the tested IC 20 can be relieved or not.

As discussed above, the timing generator 13 generates, in accordance with the timing set information TS given from the pattern generator 12, a timing signal (clock pulse) for defining a rise timing and a fall timing of the waveform of a test pattern signal which is to be applied to an IC under test 20, a timing signal (clock pulse) for a strobe pulse defining a timing of the logical comparison in the logical comparator 18, and the like.

Timings and periods for generating those timing signals are written as timing set information in the test program PM created by a user. The IC tester is arranged such that a test pattern signal is applied to an IC under test 20 with an operating period or duty cycle and at a timing intended by a user, thereby to operate the IC under test 20, and that whether the operation of the IC under test 20 is proper or not can be tested.

FIG. 5 shows an example of a specific circuit configuration of each of the timing generator 13, the waveform shaping device 14, and the waveform generator 15. The timing generator 13 comprises a period generator 21 provided with a period data memory (not shown) in which period data supplied from the main controller 11 is stored, a clock generator 22 to which are supplied from the period generator 21 period pulses generated on the basis of period data previously set in the period data memory of the period generator 21, and a clock data processing circuit 23 provided with a period data memory 23M in which period data supplied from the main controller 11 is stored, the clock data processing circuit 23 being operative only when various kinds of data are previously set, to supply data for specifying a timing of clock generation to a clock data memory 24 provided in the clock generator 22. Therefore, the clock data processing circuit 23 is under unoperated condition when a testing for ICs are done.

On setting various kinds of data, period data RATDAT supplied from the main controller (see FIG. 4) is supplied to an input terminal T1 of the timing generator 13 and clock data CLDAT also supplied from the main controller is supplied to an input terminal T2 of the timing generator 13. The input terminal T1 is connected to both of the period generator 21 and the clock data processing circuit 23. Therefore, the period data RATDAT supplied to the input terminal T1 is supplied to both of the period generator 21 and the clock data processing circuit 23 to be stored in the period data memories thereof. The input terminal T2 is connected only to the clock data processing circuit 23, and hence the clock data CLDAT supplied to the input terminal T2 is supplied only to the clock data processing circuit 23. As described above, the clock data CLDAT is supplied to the input terminal T2 of the clock data processing circuit 23 after the period data RATDAT has been stored in the period data memory.

After the period data RATDAT has been set in the period data memory 23M of the clock data processing circuit 23, the clock data processing circuit 23 compares clock data CLDAT supplied to the input terminal T2 from the main controller with period data RATDAT read out of the period data memory 23M by timing set information TS. When the value of the clock data CLDAT is smaller than the value of the period data RATDAT, the clock data processing circuit 23 generates a flag SAME (hereinafter referred to as same flag) indicating that a clock pulse is to be generated within the period corresponding to the value of this period data RATDAT, and directly supplies the same flag SAME and the received clock data CLDAT to the clock data memory 24 provided in the clock generator 22.

On the other hand, when the value of the clock data CLDAT is greater than the value of the period data RATDAT, the clock data processing circuit 23 generates a flag NEXT (hereinafter referred to as next flag) indicating that a clock pulse is to be generated in the next period, and supplies the next flag NEXT and an absolute value of a difference value between the received clock data CLDAT and the read-out period data RATDAT to the clock data memory 24 provided in the clock generator 22.

For this reason, the clock data processing circuit 23 comprises, in this example, a subtracter 25, a gate 26 (an AND gate in this example) and a multiplexer 27 in addition to the period data memory 23M. The subtracter 25 has two input terminals A and B, one output terminal and one carry signal output terminal CR. Period data RATDAT read out of the period data memory 23M is supplied to the input terminal B and clock data CLDAT is supplied to the input terminal A. The subtracter 25 subtracts the clock data CLDAT from the period data RATDAT (B−A).

When the subtraction result is positive (RATDAT>CLDAT), a carry signal output terminal CR is maintained in a state that it is outputting logical L ("0"). The carry signal output terminal CR is connected to one input terminal of the AND gate 26 and the other input terminal of the AND gate 26 is connected to a mode setting input terminal MT. Though this mode setting input terminal MT is set to logical H ("1"), the output of the AND gate 26 is at logical L because the carry signal output terminal CR is maintained at logical L. As a result, this logical L is supplied to a control terminal S of the multiplexer 27 and to the clock data memory 24, respectively.

The multiplexer 27 directly outputs, when the logical L is supplied to its control terminal S, the clock data CLDAT supplied to its input terminal A to the clock data memory 24 to store the clock data CLDAT therein. In addition, the logical L supplied to the clock data memory 24 and which is the output of the AND gate 26 is stored in the clock data memory 24 as a same flag SAME.

On the other hand, when the subtraction result is inverted to a negative value, a logical H is outputted from the carry signal output terminal CR. As a result, the logical H is outputted from the output terminal of the AND gate 26 and is supplied to the control terminal S of the multiplexer 27 and to the clock data memory 24, respectively. The multiplexer 27 selects its input terminal B when the logical H is supplied to its control terminal 8, and outputs the absolute value of the subtraction result of the subtracter 25 supplied to the input terminal B to write the subtraction result in the clock data memory 24. At the same time, the logical H from the carry signal output terminal CR of the AND gate 26 is supplied to the clock data memory 24 and is stored therein as a next flag NEXT indicating that a clock pulse is to be generated in the next period.

FIG. 7 shows an example of the relationship between timing set information TS, and period data RATDAT previously set in the period data memory 23M of the clock data processing circuit 23 (the same period data RATDAT is also previously set in the period data memory of the period generator 21) and clock data CLDAT supplied from the main controller, and the relationship between flags set in the clock data memory 24 of the clock generator 22 by the clock data processing circuit 23 performing the operation process on the basis of the period data and the clock data as described above and clock data. As shown in FIG. 7, in the period data memory and the clock data memory are previously stored timing set information, and period data and clock data in corresponding relationship therebetween.

For example, when timing set information TS1 is given to the clock data processing circuit 23 from the pattern generator 12, period data of 200 ns corresponding to TS1 is read out of the period data memory 23M of the clock data processing circuit 23. When timing set information TS3 is given, period data of 100 ns corresponding to TS3 is read out of the period data memory 23M. On the other hand, when timing set information TS1 is given to the period generator 21 and the clock generator 22 from the pattern generator 12, period data of 200 ns corresponding to TS1 is read out of the period data memory of the period generator 21 and clock data of 100 ns corresponding to TS1 is read out of the clock data memory 24 of the clock generator 22 together with a same flag SAME. When timing set information TS3 is given, period data of 100 ns corresponding to TS3 is read out of the period data memory of the period generator 21 and clock data of 30 ns corresponding to TS3 is read out of the clock data memory 24 of the clock generator 22 together with a next flag NEXT.

In the case of setting various kinds of data, it is assumed that timing set information is generated from the pattern generator 12 in order of TS1, TS2, TS3, and TS2 (TS1→TS2→TS3→TS2), period data RATDAT previously set in the period data memory 23M of the clock data processing circuit 23 is as shown in FIG. 7, and clock data CLDAT supplied to the input terminal T2 of the timing generator 13 from the main controller is also as shown in FIG. 7.

Further, though only three timing set informations TS1 to TS3 are shown in FIG. 7, many timing informations and period data, clock data flags and the like corresponding to the timing set informations are usually set beforehand. In addition, the sequence of generation of timing set information is previously programmed by a user and hence there are various sequences.

First, in the first cycle, timing set information TS1 is generated from the pattern generator 12 and is supplied to the clock data processing circuit 23. In response thereto, period data of 200 ns is read out of the period data memory 23M of the clock data processing circuit 23 to be supplied to the one input terminal B of the subtracter 25. At the same time, to the other input terminal A of the subtracter 25 is supplied from the main controller clock data of 100 ns through the input terminal T2 of the timing generator 13. In this case, the period data of 200 ns is greater than the clock data of 100 ns, and hence logical L is outputted from the carry signal output terminal CR of the subtracter 25. As a result, the clock data of 100 ns is stored as 100 ns in the clock data memory 24 as it is, and concurrently, a same flag SAME representing that a clock pulse is to be generated in the same period is stored in the clock data memory 24.

In the second cycle, timing set information TS2 is generated from the pattern generator 12 and is supplied to the clock data processing circuit 23. In response thereto, period data of 150 ns is read out of the period data memory 23M of the clock data processing circuit 23 to be supplied to the one input terminal B of the subtracter 25. At the same time, to the other input terminal A of the subtracter 25 is supplied from the main controller clock data of 80 ns through the input terminal T2 of the timing generator 13. In this case, the period data of 150 ns is greater than the clock data of 80 ns, and hence logical L is outputted from the carry signal output terminal CR of the subtracter 25, too. As a result, the clock data of 80 ns is stored as 80 ns in the clock data memory 24 as it is, and concurrently, a same flag SAME representing that a clock pulse is to be generated in the same period is stored in the clock data memory 24.

In the third cycle, timing set information TS3 is generated from the pattern generator 12 and is supplied to the clock data processing circuit 23. In response thereto, period data of 100 ns is read out of the period data memory 23M of the clock data processing circuit 23 to be supplied to the one input terminal B of the subtracter 25. At the same time, to the other input terminal A of the subtracter 25 is supplied from the main controller clock data or 130 ns through the input terminal T2 of the timing generator 13. In this case, the period data of 100 ns is smaller than the clock data of 130 ns, and hence logical H is outputted from the carry signal output terminal CR of the subtracter 25. As a result, the clock data of 100 ns is not supplied to the clock data memory 24, and instead thereof, the multiplexer 27 selects the absolute value (30 ns) of the subtraction result from the output terminal of the subtracter 25, which is stored in the clock data memory 24 as clock data. At the same time, logical H from the output terminal of the AND gate 26 is supplied to the clock data memory 24 to be stored therein as a next flag NEXT representing that a clock pulse is to be generated in the next period.

Lastly, in the fourth cycle, timing set information TS2 is generated from the pattern generator 12 and is supplied to the clock data processing circuit 23. In response thereto, period data of 150 ns is read out of the period data memory 23M of the clock data processing circuit 23 to be supplied to the one input terminal B of the subtracter 25. At the same time, to the other input terminal A of the subtracter 25 is supplied from the main controller clock data of 80 ns through the input terminal T2 of the timing generator 13. In this case, the period data of 150 ns is greater than the clock data of 80 ns, and hence logical L is outputted from the carry signal output terminal CR of the subtracter 25. As a result, the clock data of 80 ns is stored as 80 ns in the clock data memory 24 as it is, and concurrently, a same flag SAME representing that a clock pulse is to be generated in the same period is stored in the clock data memory 24.

In such manner, flags and clock data shown in right column of FIG. 7 are previously set in the clock data memory 24 of the clock generator 22.

FIG. 6 shows in waveform period pulses RT and clock pulses CL generated respectively from the period generator 21 and the clock generator 22 of the timing generator 13 constructed as shown in FIG. 5, in the case that period data shown in FIG. 7 is previously set in the period data memory of the period generator 21, and that clock data and flags shown in FIG. 7 are previously set in the clock data memory 24, together with a test pattern data PTND generated by the pattern generator 12 and a test pattern signal PTNS generated thereby. Further, in this example, it is assumed that the pattern generator 12 supplies timing set information TS to the period generator 21 and the clock generator 22 as well as generates test pattern data PTND of four cycles in the whole as shown in FIG. 6A in which logical "1" and logical "0" are alternated with each other for every period.

The period generator 21 generates period pulses in real time from its period data memory based on timing set information TS given from the pattern generator 12 and supplies the pulses to the clock generator 22. The clock generator 22 delays, when it receives the period pulses from the period generator 21, each of the period pulses by a time interval determined by a clock data and a flag stored in the clock data memory 24 and outputs them as clock pulses.

Assuming that timing set information for each cycle is generated from the pattern generator 12 in order of TS1→TS1→TS3→TS2, and that period data RATDAT previously set in the period data memory of the period generator 21, and flags and clock data previously set in the clock data memory 24 are as shown in FIG. 7, the period generator 21 sequentially generates period pulses RT (RT1→RT2→RT3→RT4) shown in FIG. 6B by period data (200 ns→150 ns→100 ns→150 ns) read out of its period data memory based on timing set information TS1→TS2→TS3→TS2 supplied from the pattern generator 12.

Since timing set information for each cycle is also supplied to the clock generator 22 at the same time, flags and clock data previously set in the clock data memory 24 of the clock generator 22 are read out therefrom by this timing set information, and the clock generator 22 delays, when period pulses RT1, RT2, RT3, RT4 are supplied thereto from the period generator 21, each of the period pulses by a time interval corresponding to the value determined by a flag and clock data stored in the clock data memory 24 and outputs clock pulses CL1, CL2, CL3, CL4 shown in FIG. 6C.

Explaining further in detail, in the example shown in FIG. 7, since the period data are read out of the period data memory of the period generator 21 in order of 200 ns, 150 ns, 100 ns and 150 ns, period pulses RT generated from the period generator 21 have periods of 200 ns between RT1 and RT2, 150 ns between RT2 and RT3, 100 ns between RT3 and RT4, and 150 ns between RT4 and RT5, respectively, as shown in FIG. 6B.

In the first period associated with the period pulse RT1, a same flag SAME and clock data of 100 ns are read out of the clock data memory 24 of the clock generator 22 based on the timing set information TS1. Thus, the first clock CL1 from the clock generator 22 is generated at a timing delayed by 100 ns from the period pulse RT1 within the same period, as shown in FIG. 6C.

In the second period associated with the period pulse RT2, a same flag SAME and clock data of 80 ns are read out of the clock data memory 24 of the clock generator 22 based on the timing set information TS1. Thus, the second clock CL2 from the clock generator 22 is generated at a timing delayed by 80 ns from the period pulse RT2 within the same period, as shown in FIG. 6C.

In the third period associated with the period pulse RT3, a next flag NEXT and clock data of 30 ns are read out of the clock data memory 24 of the clock generator 22 based on the timing set information TS3. Thus, the third clock CL3 from the clock generator 22 is not generated within the third period and is generated at a timing delayed by 30 ns from the period pulse RT4 in the next period, as shown in FIG. 6C, this timing being the same as a timing delayed by 130 ns from the period pulse RT3.

In the fourth period associated with this period pulse RT4, a same flag SAME and clock data of 80 ns are read out of the clock data memory 24 of the clock generator 22 based on the timing set information TS1. Thus, the fourth clock CL4 from the clock generator 22 is generated at a timing delayed by 80 ns from the period pulse RT4 within the same period, as shown in FIG. 6C.

From the foregoing discussion, it would be understood that, in the example shown in FIG. 7, when clock data CLDAT sent from the main controller is smaller than period data RATDAT previously set in the period memory 23M of the clock data processing circuit 23, a same flag SAME is set in the clock data memory 24 of the clock generator 22, and at the same time, the clock data CLDAT sent from the main controller is directly set in the clock data memory 24 as it is, and that when the clock data CLDAT is greater than the period data RATDAT, a next flag NEXT is set in the clock data memory 24 of the clock generator 22, and at the same time, the absolute value of a difference between the previously set period data and the clock data CLDAT sent from the main controller is set in the clock data memory 24.

It would be also understood that test pattern data PTND having four cycles in total is generated from the pattern generator 12, and a clock pulse is generated within the same period in case the same flag SAME is set, and a clock pulse is generated in the next period in case the next flag NEXT is set.

Here, the waveform shaping device 14 and the waveform generator 15 will briefly described although those are not related to the present invention.

The waveform shaping device 14 is constructed, in the example shown in FIG. 5, by a first and a second two gates 141 and 142 (both are AND gates, in this example). Both of the two input terminals of the first AND gate 141 are a non-inverting input terminal and one of the two input terminals of the second AND gate 142 is an inverting input terminal. Test pattern data PTND is supplied to one input terminal of the first AND gate 141 and the inverting input terminal of the second AND gate 142 from the pattern generator 12. In addition, clock pulses CL1, CL2, CL3 and CL4 are supplied to both of the other input terminals of the AND gates 141 and 142 from the clock generator 22, respectively.

It is assumed that test pattern data PTND outputted from the pattern generator 12 is given in the sequence, for example, such as logical "1" in the first cycle, logical "0" in the second cycle, logical "1" in the third cycle, and logical "0" in the fourth cycle, as shown in FIG. 6A. Since the first AND gate 141 is in an enable state (on state) at the timing when the first clock CL1 is generated, the first clock CL1 is supplied via the first gate 141 to the set terminal S of an R-S (set treset) flip-flop FF which constitutes the waveform generator 15. As a result, the output waveform of the waveform generator rises up to logical H at the timing of the first clock CL1, as shown in FIG. 6D.

In the second cycle, since the test pattern data PTND is logical "0", the second gate 142 is in an enable state this time and the second clock CL2 is supplied to a reset terminal R of the R-S flip-flop FF via the second gate 142. Therefore, the output waveforn of the waveform generator 15 falls down to logical L at the timing of the second clock CL2, as shown in FIG. 6D.

In the third cycle, since the test pattern data PTND is logical "1", the first gate 141 is in an enable state. As mentioned above, though the third clock CL3 is not generated within the third period, the waveform generator 15 shown in FIG. 5 generates, in the illustrated case, an NRZ waveform (non-return to zero waveform). Therefore, the first gate 141 is held in an enable state until the third clock CL3 is generated. The third clock CL3 is supplied to the set terminal S of the R-S flip-flop FF via the first gate 141, thereby to cause the output waveform of the waveform generator to rise up to the logical H at the timing of the third clock CL3, as shown in FIG. 6D.

In the fourth cycle, since the test pattern data PTND is logical "0", the second gate 142 becomes an enable state, after the third clock CL3 has been generated and has passed through the first gate 141. The fourth clock CL4 is supplied to the reset terminal R of the R-S flip-flop FF via the second gate 142. Thus, as shown in FIG. 6D, the output waveform of the waveform generator falls down to the logical L at the timing of the fourth clock CL4.

In such a way, a test pattern signal PTNS is produced by the clocks CL1, CL2, CL3, and CL4 outputted from the clock generator 22 and this test pattern signal PTNS is supplied to an IC under test 20 via the driver group 16. Further, as stated above, the waveform generator shown in FIG. 5 generates an NRZ waveform by way of example. However, in practice, the waveform generator has also circuit configurations for generating other waveform modes added thereto.

As shown in FIG. 5, a system which uses timing signals (clock pulses) generated from one timing generator 13 to generate a test pattern signal is called ONE WAY system in this technical field. On the other hand, a system which multiplexes timing signals (clock pulses) generated from a plurality of timing generators and uses the multiplexed timing signal to generate a test pattern signal is called MULTIPLE WAY system in this technical field.

FIG. 8 is a block diagram showing an example of the timing generator used in case of generating a test pattern signal in a multiple way system mentioned above. In this example, there are provided two sets of a circuit configuration each comprising the timing generator 13, the pattern generator 12, and the waveform shaping device 14 all of which have the same construction as those shown in FIG. 5. In addition, two OR gates 151 and 152 are added to the waveform generator 15, and it is arranged that outputs of the two corresponding AND gates 141A, 141B of the waveform shaping devices 14A, 14B and outputs of the two corresponding AND gates 142A, 142B of the waveform shaping devices 14A, 14B of respective sets are supplied to the set terminal S and the reset terminal R of the R-S flip-flop FF of the waveform generator via the OR gates 151 and 152, respectively.

Further, for clarity of the explanation, circuits and elements in FIG. 8 corresponding to those in FIG. 5 are denoted by the same characters as those in FIG. 5, and in addition, the characters of the circuits and the elements of one set (the circuit configuration shown in FIG. 8 at the upper side thereof) have a further letter "A" added thereto, and the characters of the circuits and the elements of the other set (the circuit configuration shown in FIG. 8 at the lower side thereof) have a further letter "B" added thereto.

As shown in FIG. 8, a system in which two timing generators 13A and 13B are prepared, and timing signals (clock pulses) outputted from these timing generators 13A, 13B are multiplexed to supply the multiplexed timing signal to the waveform generator 15, thereby to generate a test pattern signal is called TWO WAY system in this technical field.

As already described, the pattern generators 12A and 12B of respective sets generate a test pattern data PTND programmed by a user as well as timing set information TS. There are test pattern data PTND and timing set information for every pattern generating cycle.

In FIG. 8, on setting various kinds of data, like the case of the timing generator shown in FIG. 5, period data RATDAT supplied from the main controller (see FIG. 4) is supplied to both of the input terminals T1A and T1B of the timing generators 13A and 138, respectively, and clock data CLDAT is supplied to both of the input terminals T2A and T2B of the timing generators 13A and 13B, respectively. The input terminals T1A and T1B are connected to both of the period generator 21A and the clock data processing circuit 23A and both of the period generator 21B and the clock data processing circuit 23B, respectively. Therefore, the period data RATDAT supplied to the input terminals T1A and T1B are supplied to both of the period generator 21A and the clock data processing circuit 23A and both of the period generator 21B and the clock data processing circuit 23B to be stored in the period data memories thereof.

The input terminals T2A and T2B are connected only to the clock data processing circuit 23A and 23B respectively, and hence the clock data CLDAT supplied to the input terminals T2A and T2B is supplied only to the clock data processing circuits 23A and 23B, respectively. As described above, the clock data CLDAT is supplied to the input terminals T2A and T2B of the clock data processing circuits 23A and 23B, after the period data RATDAT has been stored in the period data memories.

After the period data RATDAT have been set in the period data memories 23MA and 23MB of the clock data processing circuits 23A and 23B respectively, the clock data processing circuits 23A and 23B compare clock data CLDAT supplied to the respective input terminals T2A and T2B from the main controller with period data RAT MAT read out of the period data memories 23MA and 23MB, respectively. When the value of the clock data CLDAT is smaller than the value of the period data RATDAT, the clock data processing circuits 23A and 23B generate flags SAME each indicating that a clock pulse is to be generated within the period corresponding to the value of this period data RATDAT respectively, and directly supply the same flags SAME and the received clock data CLDAT to the clock data memories 24A and 24B of the clock generators 22A and 22B, respectively.

On the other hand, when the value of the clock data CLDAT is greater than the value of the period data RATDAT, the clock data processing circuits 23A and 23B generate flags NEXT each indicating that a clock pulse is to be generated in the next period respectively, and supply the next flags NEXT and difference values (absolute values) between the received clock data CLDAT and the read-out period data RATDAT to the clock data memories 24A and 24B, respectively.

Further, the clock data processing circuits 23A and 23B of respective sets have the same circuit configuration as that of the clock data processing circuit 23 shown in FIG. 5. That is, the clock data processing circuit 23A is constituted by a subtracter 25A, an AND gate 26A, and a multiplexer 27A, and the clock data processing circuit 23B is constituted by a subtracter 25B, an AND gate 26B, and a multiplexer 27B.

In addition, since it is two way system, test pattern data PTND and timing set information TS are generated in alternate cycles from the pattern generators 12A and 12B of respective sets, and the timing set information TS is supplied to the corresponding timing generators 13A and 13B. Moreover, the period generators 21A and 21B of respective sets are arranged such that they can transmit and receive timing set information therebetween.

Now, the operation of the timing generators shown in FIG. 8 will be described.

It is assumed that, for example, a test program that a user has created is one for generating test pattern data PTND having four cycles in the whole, and as shown in FIG. 9, timing set information TS1 corresponds to that period data RATDAT previously set in the respective period data memories of the period generators 21A and 21B and the respective period data memories 23MA and 23MB of the clock data processing circuits 23A and 23B are 90 ns, clock data CLDAT sent from the main controller when various kinds of data are set are 60 ns, and flags and clock data previously set in the clock data memories 24A and 24B of the clock generators 22A and 22B are SAME and are 60 ns respectively; timing set information TS1 corresponds to that period data RATDAT previously set in the respective period data memories of the period generators 21A and 21B and the respective period data memories 23MA and 23MB of the clock data processing circuits 23A and 23B are 150 ns, clock data CLDAT sent from the main controller when various kinds of data are set are 80 ns, and flags and clock data previously set in the clock data memories 24A and 24B of the clock generators 22A and 22B are SAME and are 80 ns respectively, timing set information TS3 corresponds to that period data RATDAT previously set in the respective period data memories of the period generators 21A and 21B and the respective period data memories 23MA and 23MB of the clock data processing circuits 23A and 23B are 100 ns, clock data CLDAT sent from the main controller when various kinds of data are set are 130 ns, and flags and clock data previously set in the clock data memories 24A and 24B of the clock generators 22A and 22B are SAME and are 130 ns respectively.

In addition, it is assumed that the timing set information for each cycle is supplied to the corresponding timing generators 13A and 13B in order of TS1, TS2, TS3 and TS2 (TS1→TS2→TS3→TS2), and that the test pattern data PTND is generated in order of logical "1", logical "0", logical "1" and logical "0" as shown in FIG. 10.

In such case, the test pattern data PTND and the timing set information TS generated from each of the pattern generators 12A and 12B are in order of PTND1, PTND0, PTND1, PTND0 and in order of TS1, TS2, TS3, TS2, as shown in FIG. 11A and FIG. 11B, respectively. Observing only the timing set information TS, it is as shown in FIG. 11C and FIG. 11D. That is, since the period generators 21A and 21B of respective sets are arranged such that they can transmit and receive timing set information TS between them, the period generator 21A of one set sequentially generates period pulses with a period of the sum of the period data of TS1 and the period data of TS2 (a period of TS1+TS2) and with a period of the sum of the. period data of TS3 and the period data of TS1 (a period of TS3+TS2) as shown in FIG. 11C, and the period generator 21B of the other set sequentially generates period pulses with a period of the sum of the period data of TS1 and the period data of TS3 (a period of TS1+TS3) starting at a timing point delayed by a value of the period data of TS1 from the period generator 21A, as shown in FIG. 11D.

The above operations of the period generators are specifically shown in FIGS. 11E and 11F in which the period generator 21A sequentially generates period pulses with a period of 240 ns (90 ns+150 ns ) and with a period of 250 ns (100 ns+150 ns ) as shown in FIG. 11E, and the period generator 21B sequentially generates period pulses with a period of 250 ns (150 ns+100 ns ) starting at a timing point delayed by a time interval of 90 ns (the period of TS1) from the period generator 21A, as shown in FIG. 11F.

Both the period generators 21A and 21B generate, based on the timing set information TS given from the pattern generators 12A and 12B, period pulses from their period data memories in real time to supply the pulses to the clock generators 22A and 22B, respectively. The clock generators 22A and 22B delay, when they receive period pulses from the period generators 21A and 21B, each of the period pulses by a time interval determined by clock data and a flag previously set in each of the clock data memories 24A and 24B, and output the delayed pulses as clock pulses, respectively.

Assuming that timing set information for each cycle is generated from the pattern generators 12A and 12B in order of TS1→TS2→TS3→TS2, and that period data RATDAT previously set in the respective period data memories of the period generators 21A and 21B, and flags and clock data previously set in the respective clock data memories 24A and 24B are as shown in FIG. 9, the period generators 21A and 21B sequentially generate period pulses RTA (RT1A, RT2A, RT3A) shown in FIG. 10B and period pulses RTB (RT1B, RT2B) shown in FIG. 10E by period data (90 ns→150 ns→100 ns →150 ns ) read out of the period data memories thereof based on timing set information TS1→TS2→TS3→TS2 supplied from the pattern generators 12A and 12B, respectively. That is, the period between the period pulses RT1A and RT2A is 240 ns, and the period between the period pulses RT2A and RT3A is 250 ns. Also, the period between the period pulses RT1B and RT2B is 250 ns.

Since timing set information for each cycle is also supplied to the clock generators 22A and 22B at the same time, flags and clock data previously set in the clock data memories 24A and 24B of the clock generators 22A and 22B are read out therefrom by this timing set information, and the clock generator 22A of one set delays, when period pulses RT1A, RT2A, RT3A are supplied thereto from the period generator 21A, each of the period pulses by a time interval corresponding to the value determined by a flag and clock data previously set in the clock data memory 24A and generates clock pulses CL1, CL3 shown in FIG. 10C. The clock generator 22B of the other set delays, when period pulses RT1B, RT2B are supplied thereto from the period generator 21B, each of the period pulses by a time interval corresponding to the value determined by a flag and clock data previously set in the clock data memory 24B and generates clock pulses CL2, CL4 shown in FIG. 10F.

Specifically explaining further, since both the clock data memories 24A and 24B have the flags and the clock data shown in FIG. 9 previously set therein, the clock generator 22A of the one set generates a clock pulse CL1 at a timing delayed by 60 ns from the first period pulse RT1A of the period pulses RTA and a clock pulse CL3 at a timing delayed by 130 ns from the second period pulse RT2A of the period pulses RTA as shown in FIG. 10C. On the other hand, the clock generator 22B of the other set generates a clock pulse CL2 at a timing delayed by 80 ns from the first period pulse RT1B of the period pulses RTB and a clock pulse CL4 at a timing delayed by 80 ns from the second period pulse RT2B of the period pulses RTB as shown in FIG. 10F.

In this manner, in the two way system, the two period generators 21A and 21B alternately output therefrom the period pulses RT1A, RT1B, RT2A, RT2B, RT3A at intervals of the sum of values of two period data corresponding to two timing set informations specified by a program, which is defined as a period of each of the period generators 21A and 21B.

Therefore, observing the data corresponding to the timing set information TS3 shown in FIG. 9, the clock data is greater than the period data, but the period of the period generator 21A at that time is 250 ns which is the sum of two period data values (TS3+TS1), and hence a flag and clock data previously set in the clock data memory 24A are same flag SAME and 130 ns, respectively.

On the other hand, a test pattern signal PTNS outputted from the waveform generator has a waveform as shown in FIG. 10G which rises up to logical H at the timing of the clock CL1, falls down to logical L at the timing of the clock CL2, rises up to logical H at the timing of the clock CL3, and falls down to logical L at the timing of the clock CL4.

Both the clock data processing circuits 23A and 23B have mode setting input terminals MTA and MTB connected thereto, respectively, and in case of operating the timing generators shown in FIG. 8 in two way system, on setting various kinds of data, a mode setting signal of logical L is applied to both the mode setting input terminals MTA and MTB, thereby to maintain the AND gates 26A and 26B in a disable state (off state). As a result, even if an output signal of logical H is generated on the carry signal output terminal CR of each of the subtracters 25A and 25B due to that clock data is greater than period data, this H logical signal cannot pass through the AND gate 26A or 26B, and hence the H logical signal is not supplied to the control terminal S of the multiplexer 27A or 27B and the clock data memory 24A or 24B. Accordingly, the multiplexer 27A or 27B supplies only clock data CLDAT given to the input terminal T2A or T2B to the clock data memory 24A or 24B, and t does not supply the subtraction result from the output terminal of the subtracter 25A or 25B to the clock data memory 24A or 24B. In addition, any next flag NEXT of logical H is not stored in the clock data memory 24A or 24B.

Further, in case of operating the timing generators shown in FIG. 8 in one way system, as already described above with reference to FIG. 5, on setting various kinds of data, a logical H is given to the mode setting input terminals MTA and MTB, and hence the subtraction result from the output terminal of the subtracter 25A or 25B and a next flag NEXT can be previously set in the clock data memory 24A or 24B.

As described above, the period generators 21A and 21B have a function of generating period pulses in real time on the basis of period data read out of their period data memories by timing set information and generating period pulses. However, the clock generators 22A and 22B do not have a function of generating clock pulses in real time on the basis of period pulses supplied from the period generators 21A and 21B. The reason thereof is as follows.

Even if only one period generator is provided in an IC tester, the IC tester can attain its object sufficiently by use of this period generator. However, the IC tester must have the same number of clock generators as that of channels provided in the IC tester. Since the number of channels provided in a recent IC tester extends from several hundreds to several thousands, provision of a clock generator having a function of arithmetically and logically operating in real time in every channel results in a circuitry of a considerable scale. As a result, there occur problems that the size of the IC tester becomes considerably large, its power consumption is remarkably increased, the cost of the IC tester is very high, and the like.

For this reason, such arrangement is taken that period data is previously supplied from the main controller to the period data memories of the period generators 21A and 21B and of the clock data processing circuits 23A and 23B to store therein together with timing set information TS programmed by a user, and next, timing set information TS is supplied from the pattern generators 12A and 12B to the clock data processing circuits 23A and 23B, thereby to read out period data previously set in the period data memories 23MA and 23MB of the clock data processing circuits 23A and 23B, and at the same time, clock data is supplied from the main controller to the clock data processing circuits 23A and 23B, and the result of operation of the period data and the clock data is supplied together with a flag to the clock data memories 24A and 24B of the clock generators 22A and 22B thereby previously setting data in the clock data memories 24A and 24B.

Consequently, in case of operating the timing generators shown in FIG. 8 in the two way system, data such as "NEXT" (next flag) and "20 ns" indicating that a clock is to be generated at a timing over two cycles, for example, cannot be set in the clock data memories 24A and 24B. Now the reason thereof will be described.

In the timing generators in two way system shown in FIG. 8, as already stated above, it is assumed that the timing set information TS is supplied from the pattern generators 12A and 12B to the timing generators 13A and 13B in order of TS1, TS2, TS3, TS2, and that the contents of the flags and the clock data previously set in the clock data memories 24A and 24B are such that, as shown in FIG. 12, the timing set information TS1 corresponds to that the flag is NEXT and the clock data is 20 ns, the timing set information TS1 corresponds to that the flag is SAME and the clock data is 80 ns, and the timing set information TS3 corresponds to that the flag is SAME and the clock data is 130 ns.

When the data of "NEXT" and "20 ns" is previously set in the clock data memory 24A in FIG. 8, the clock generator 22A generates a clock pulse CL1 at a timing delayed by 20 ns after the second period pulse RT2A has been generated, as shown in FIG. 13.

However, such data as "NEXT" and "20 ns" is data obtained solely by the arithmetic and logical operation and processing of the clock data processing circuit 23A on setting various kinds of data. Therefore, on setting various kinds of data, namely, before a test for ICs is started, if a user programs data corresponding to the data of "NEXT" and "20 ns" as the timing set information TS1, period data corresponding to the timing set information TS1 would be, for example, 90 ns if period data is the same as the period data shown in FIG. 9. Accordingly, if the sum (240 ns) of TS1 and TS1 be the period of the period generator 21A, a user must set the clock data to 260 ns. Thus, the user cannot program such that the period data is 240 ns and the clock data is 20 ns.

If the clock data processing circuit 23A can obtain the data of "NEXT" and "20 ns" by its arithmetic and logical operation and processing on the basis of data (the period data is 90 ns and the clock data is 260 ns) corresponding to this programmed timing set information TS1, it is possible to previously set this data in the clock data memory 24A.

However, only by the period data of 90 ns and the clock data of 260 ns, the clock data processing circuit 23A cannot obtain the data of "NEXT" and "20 ns" by its arithmetic and logical operation and processing because a data of 150 ns which is the period data corresponding to the timing set information TS1 is not read out yet. For this reason, the clock data processing circuit 23A cannot set the data of "NEXT" and "20 ns" in the clock data memory 24A beforehand.

In other words, it is data of "NEXT" and "170 ns" that the clock data processing circuit 23A can obtain by its arithmetic and logical operation and processing, and hence the clock data processing circuit 23A would previously set this data of "NEXT" and "170 ns" in the clock data memory 24A. This results in generation of a clock at a timing which is quite different from the timing that the user has set.

For the above reason, in case of operating the timing generators shown in FIG. 8 in two way system, as described above, it is necessary to arrange the timing generators, on previously setting various kinds of data, such that a logical L is applied to the mode setting input terminals MTA and MTB provided in both the clock data processing circuits 23A and 23B respectively, thereby to maintain the AND gates 26A and 26B in a disable state, and even if the result of subtraction of the clock data from the period data in the subtracter 25A or 25B becomes negative (−) whereby an output signal of logical H is outputted from the carry signal output terminal CR of the subtracter 25A or 25B, this logical H signal is not supplied to the multiplexer 27A or 27B and the clock data memory 24A or 24B. That is, it is necessary to prevent the subtraction result from the output terminal of the subtracter 25A or 25B from being supplied to the clock data memory 24A or 24B as well as to prevent a next flag NEXT from being set in the clock data memory 24A or 24B.

Consequently, the timing generators used in the case of generating test pattern signals in two way system have an important disadvantage that they cannot generate a clock in the next cycle. In addition, in case a user creates a program, an attention is paid such that clock data has its value which is not beyond the next cycle. This disadvantage results in a problem that an IC cannot be tested which outputs, for example, data to which a read instruction has been given after the cycle has advanced from the cycle including the timing at which the read instruction has been given to the next cycle.

Moreover, there are increasing more and more synchronous type (clock synchronized type) ICs in recent memory ICs. As is well known, the synchronous type memory ICs perform all of their operations in synchronism with clocks having a constant period. Therefore, in case of testing and measuring such synchronous type memory ICs using an IC tester, each of period data which have been previously set always has a constant value.

FIG. 14 shows an example of corresponding relationship between timing set information TS generated from the pattern generators 12A and 12B, and period data previously set in the period data memories and clock data supplied from the main controller on previously setting various kinds of data, and corresponding relationship between the timing set information TS, and flags and clock data stored in the memories 24A and 24B, in case of testing and measuring synchronous type memory ICs using the timing generators of two way system shown in FIG. 8.

As is apparent from FIG. 14, since all of the period data have a constant value (100 ns), the next period data has a known value (100 ns). Therefore, when TS1 in FIG. 14 (corresponding to that the period data is 100 ns and the clock data is 230 ns) is supplied from the pattern generator 12A to the clock data processing circuit 23A, the clock data processing circuit 23A ought to output data of flag "NEXT" and clock data of "30 ns" as shown in the columns of the contents of clock data memory in FIG. 14 by its arithmetic and logical operation and processing, thereby to store the data in the clock data memory 24A. That is, this is done by subtracting a value of two times the received period data of 100 ns (100 ns×2) from the clock data of 230 ns supplied from the main controller and by storing the subtraction result and a flag in the clock data memory 24A.

However, as described above, in the conventional timing generators of two way system it is inhibited to store a next flag "NEXT" in the clock data memory, and hence there is an important defect that a next flag "NEXT" cannot be stored in the clock data memory even in the case of testing and measuring synchronous type memory ICs.

The above-stated disadvantages not only occur in timing generators of two way system but also occur in timing generators used in generating a test pattern signal in other multiple way systems (three way system, four way system, . . . ).

SUMMARY OF THE INVENTION

An object of the present invention is to provide a timing generator which is capable of setting data indicating that a timing signal is to be generated in the next cycle, even in the case of generating a test pattern signal in multiple way system.

An another object of the present invention is to provide a timing generator which is capable of setting data indicating that a timing signal is to be generated in a subsequent cycle of up to four times the period if the value of each of period data is constant, even in the case of generating a test pattern signal in two way system.

In order to accomplish the above objects, in an aspect of the present invention, there is provided a timing generator which comprises: a plurality of N timing generators, N being an integer of 2 or greater than 2, each of the N timing generators including a clock generator, a period generator and a clock data processing circuit, the timing generator means being arranged such that a timing of generation of a clock outputted from each of the clock generators is controlled based on data previously set in a memory provided in each of the clock generators, thereby to generate a clock at a desired timing from each of the clock generators, each of the clock data processing circuits including: a multiplier for multiplying by N a value of period data read out of period data memory of the associated clock data processing circuit; and a subtracter for performing a subtraction between the period data multiplied by N by the multiplier or the period data read out of the period data memory and clock data supplied from the outside, the timing generator means further including: means for supplying, only in the case that N or more period data are in succession, the period of each of the period data being a constant, period data read out of the period data memory to each of the multipliers to multiply the period data by N, thereby providing a control signal to each of the clock data processing circuits, the control signal enabling a subtraction value outputted from an output terminal of each of the subtracters and a next flag outputted from a carry signal output terminal of each of the subtracters when a value of the clock data is greater than that of the period data multiplied by N to be stored in the memory of each of the clock generators, the next flag representing that a clock is to be generated in the next cycle, and whereby in the case of operating each timing generator in N way system, when clock data for generating a clock at a desired timing point in the next cycle is supplied together with period data read out of the associated period data memory, a next flag outputted from the carry signal output terminal of the associated subtracter and the subtraction value outputted from the output terminal of the associated subtracter can be stored in the memory of the associated clock generator.

In a preferred embodiment, the timing generator means is used in a semiconductor device testing apparatus which is arranged such that a timing of generation of a clock outputted from each of the clock generators is controlled based on data previously set in a memory provided in each of the clock generators, thereby to generate a clock at a desired timing from each of the clock generators, and the clock pulses thus generated are multiplexed to produce a test pattern signal for testing a semiconductor device using the multiplexed clock pulses, and the clock data processing circuit of each of the N timing generators includes a multiplier supplied with period data read out of period data memory of the associated clock data processing circuit, for multiplying a value of the supplied period data by N; a subtracter having one input terminal supplied with the period data multiplied by N by the multiplier or the period data read out of the period data memory, and performing a subtraction between the period data multiplied by N and clock data supplied to the other input terminal of the subtracter from the outside; selecting means for selecting one of the clock data supplied to the subtracter and a subtraction value outputted from an output terminal of the subtracter to output it to a memory provided in the associated clock generator; first control means for controlling the selecting means so as to select the clock data supplied to the subtracter when a value of clock data is smaller than that of period data, thereby preventing a subtraction value outputted from the output terminal of the subtracter from being stored in the memory of the associated clock generator; and second control means for supplying, only in the case that N or more period data are in succession, the period of each of the period data being a constant, period data read out of the period data memory to the associated multiplier to multiply the period data by N, thereby enabling the subtraction value outputted from the output terminal of the associated subtracter and a next flag outputted from a carry signal output terminal of the associated subtracter to be stored in the memory of the associated clock generator, the next flag representing that a clock is to be generated in the next cycle.

The first control means includes a gate having two input terminals and an output terminal one input terminal of which is connected to the carry signal output terminal of the associated subtracter, the other input terminal of which is connected to an inhibit signal supply terminal, and the output terminal of which is connected to a control terminal of the associated selecting means and the memory of the associated clock generator, and in the case of operating each timing generator in N way system, the first control means supplies an inhibit signal to the the other input terminal of the gate through the inhibit signal supply terminal, thereby to prevent the selecting means from selectively outputting the subtraction value outputted from the output terminal of the associated subtracter as well as prevent the gate from passing the next flag outputted from the carry signal output terminal of the associated subtracter therethrough.

The second control means includes a gate having two input terminals and an output terminal one input terminal of which is connected to the carry signal output terminal of the associated subtracter, the other input terminal of which is connected to an enabling signal supply terminal, and the output terminal of which is connected to a control terminal of the associated selecting means and the memory of the associated clock generator, and only in the case that N or more period data are in succession, the period of each of the period data being a constant, the second control means supplies an enabling signal to the the other input terminal of the gate through the enabling signal supply terminal, thereby to enable the selecting means to selectively output the subtraction value outputted from the output terminal of the associated subtracter as well as enable the gate to pass the next flag outputted from the carry signal output terminal of the associated subtracter therethrough.

The first control means and the second control means use a gate in common, the gate having two input terminals and an output terminal one input terminal of which is connected to the carry signal output terminal of the associated subtracter, the other input terminal of which is connected to an inhibit signal supply terminal and an enabling signal supply terminal, and the output terminal of which is connected to a control terminal of the associated selecting means and the memory of the associated clock generator, and in the case of operating each timing generator in N way system, an inhibit signal is supplied to the the other input terminal of the gate through the inhibit signal supply terminal, thereby to prevent the selecting means from selectively outputting the subtraction value outputted from the output terminal of the associated subtracter as well as prevent the gate from passing the next flag outputted from the carry signal output terminal of the associated subtracter therethrough, and only in the case that N or more period data are in succession, the period of each of the period data being a constant, an enabling signal is supplied to the the other input terminal of the gate through the enabling signal supply terminal, thereby to enable the selecting means to selectively output the subtraction value outputted from the output terminal of the associated subtracter as well as enable the gate to pass the next flag outputted from the carry signal output terminal of the associated subtracter therethrough, The inhibit signal supply terminal and the enabling signal supply terminal may be connected to the the other input terminal of the gate through an OR gate. In addition, the gate used in common by the first control means and the second control means may be constructed by an AND gate, and the subtracter subtracts the clock data from the period data multiplied by N only in the case that N or more period data are in succession, the period of each of the period data being a constant, and when the result of the subtraction is a negative (minus) value, a next flag of logical H is outputted from the carry signal output terminal, and an inhibit signal of logical L is supplied to the inhibit signal supply terminal, and an enabling signal of logical H is supplied to the enabling signal supply terminal.

The period data memory of each of the clock data processing circuits has various kinds of period data previously set from a main controller, and each of the subtracters performs a subtraction between period data read out of the associated period data memory or period data multiplied by N by the associated multiplier and clock data supplied from the main controller, and the next flag is outputted from the carry signal output terminal of the associated subtracter when a value of the clock data is greater than that of the period data multiplied by N.

Also, there are provided short circuits each for bypassing the associated multiplier of the multipliers, and switching means each for turning on/off the associated short circuit of the short circuits, and only in the case that N or more period data are in succession, the period of each of the period data being a constant, each of the switching means turns off the associated short circuit.

Further, based on timing set information supplied from a pattern generator to the associated clock data processing circuit of the clock data processing circuits, period data is read out of the period data memory of the associated clock data processing circuit, the period data corresponding to the timing set information.

BRIEF DESCRIPTION OF THE DRAWINGS

FIG. 14 is a diagram showing an example of corresponding relationship between timing set information given to the timing generator shown in FIG. 8, and previously set period data and clock data supplied from a main controller, and the contents of a clock data memory previously set, respectively.

DETAILED DESCRIPTION OF THE PREFERRED EMBODIMENTS

Now, an embodiment of the timing generator according to the present invention will be described in detail with reference to FIGS. 1 to 3. Further, in FIG. 1 circuits and elements corresponding to those in FIG. 8 have the same characters affixed thereto, and the explanation thereof will be omitted unless necessary.

Figure 1:
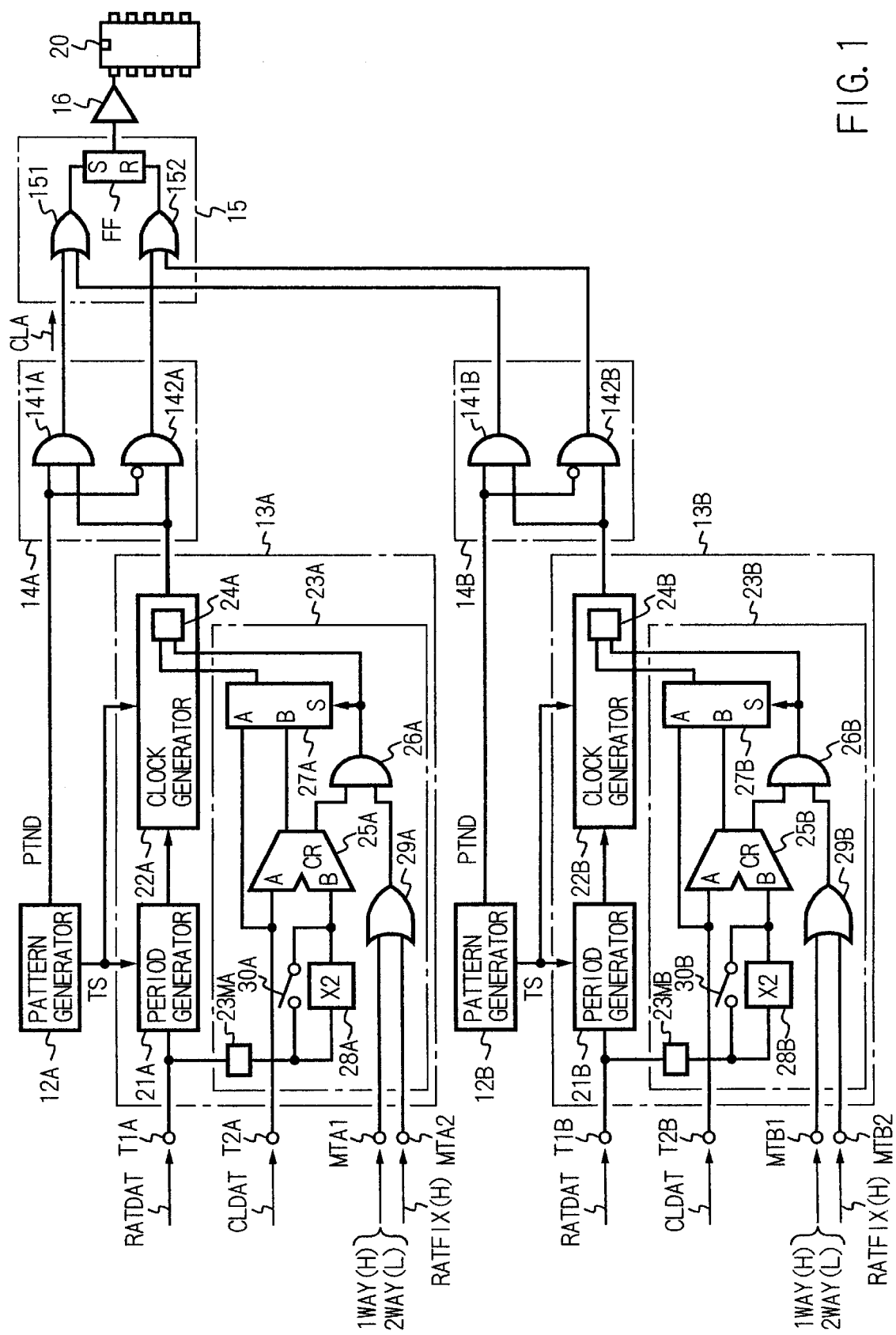
FIG. 1 is a block diagram showing the circuit configuration of an embodiment of the timing generator according to the present invention, together with a pattern generator, a waveform shaping device and a waveform generator.

FIG. 1 is a block diagram showing the circuit configuration of an embodiment of the timing generator according to the present invention, together with a pattern generator, a waveform shaping device and a waveforn generator, and a case is illustrated that the present invention is applied to a timing generator used in generating a test pattern signal in two way system.

Figure 8:
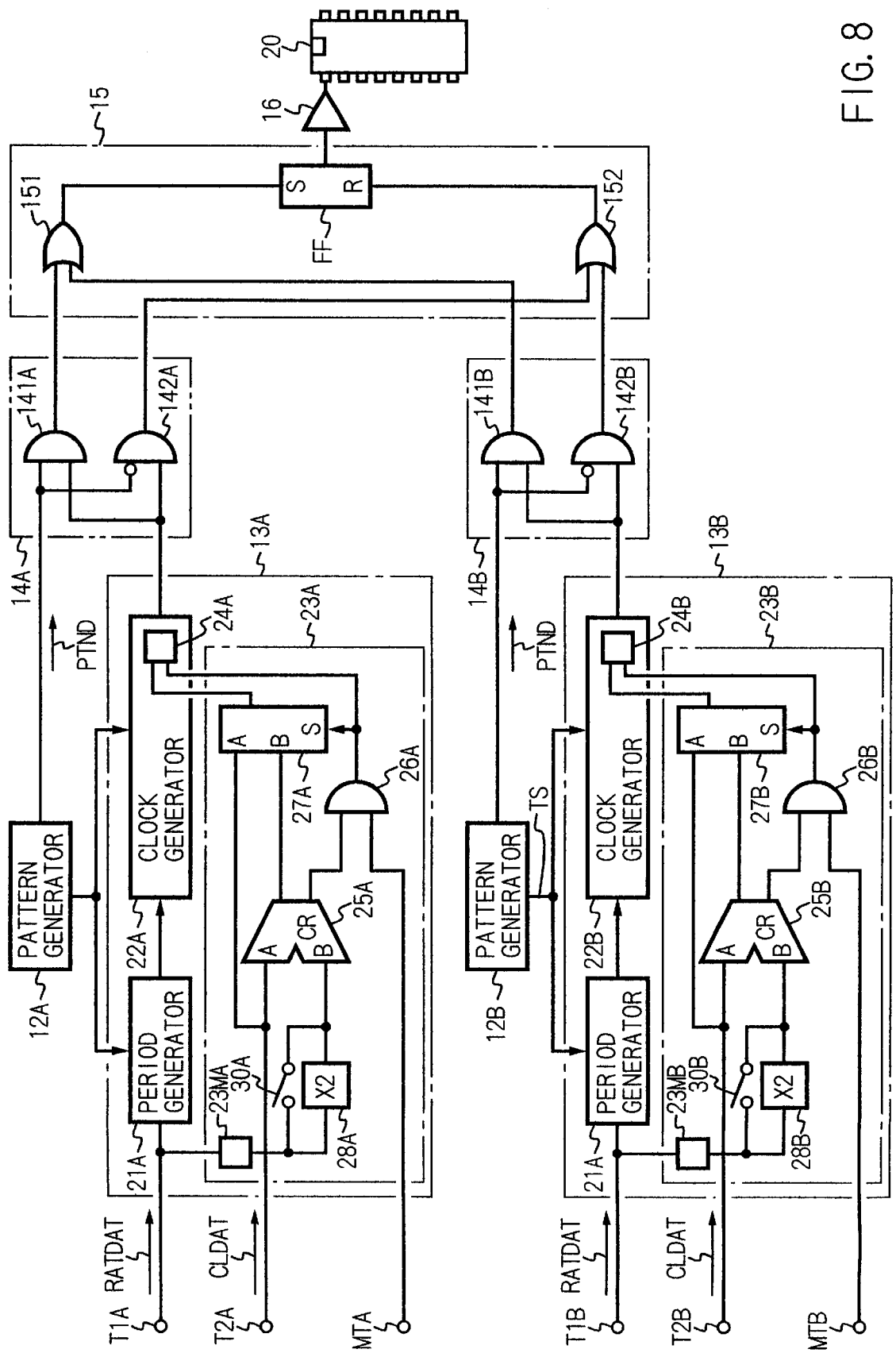
FIG. 8 is a block diagram showing a circuit configuration of the timing generator of two way system used in a conventional IC tester, together with a pattern generator, a waveforn shaping device and a waveform generator.
Figures 9, 10:
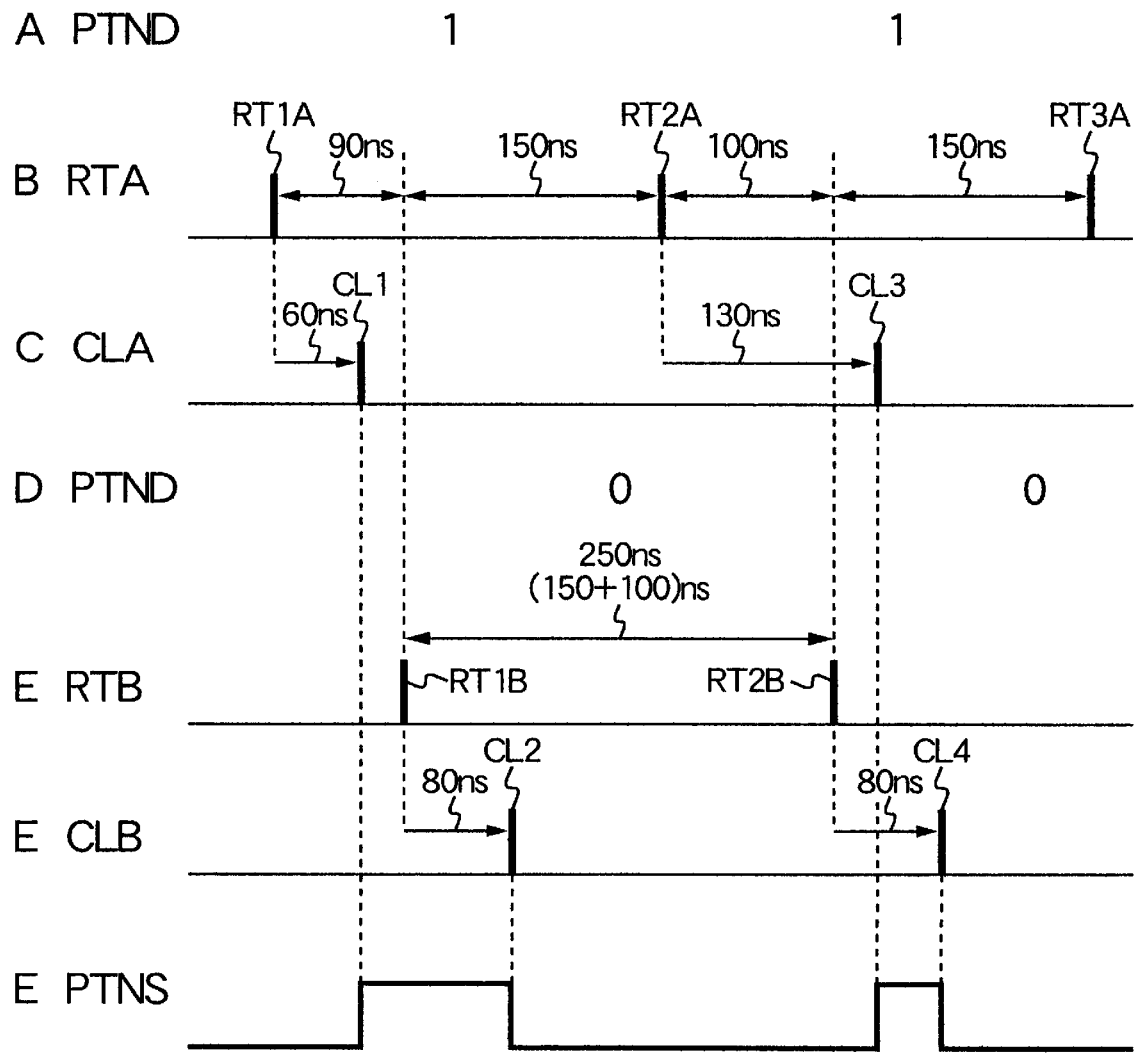
FIG. 9 is a diagram showing an example of corresponding relationship between timing set information given to the timing generator shown in FIG. 8, and previously set period data and clock data supplied from a main controller, and the contents of a clock data memory previously set, respectively.
FIG. 10 is a timing chart for explaining the operation of the timing generator shown in FIG. 8.
Figure 11:
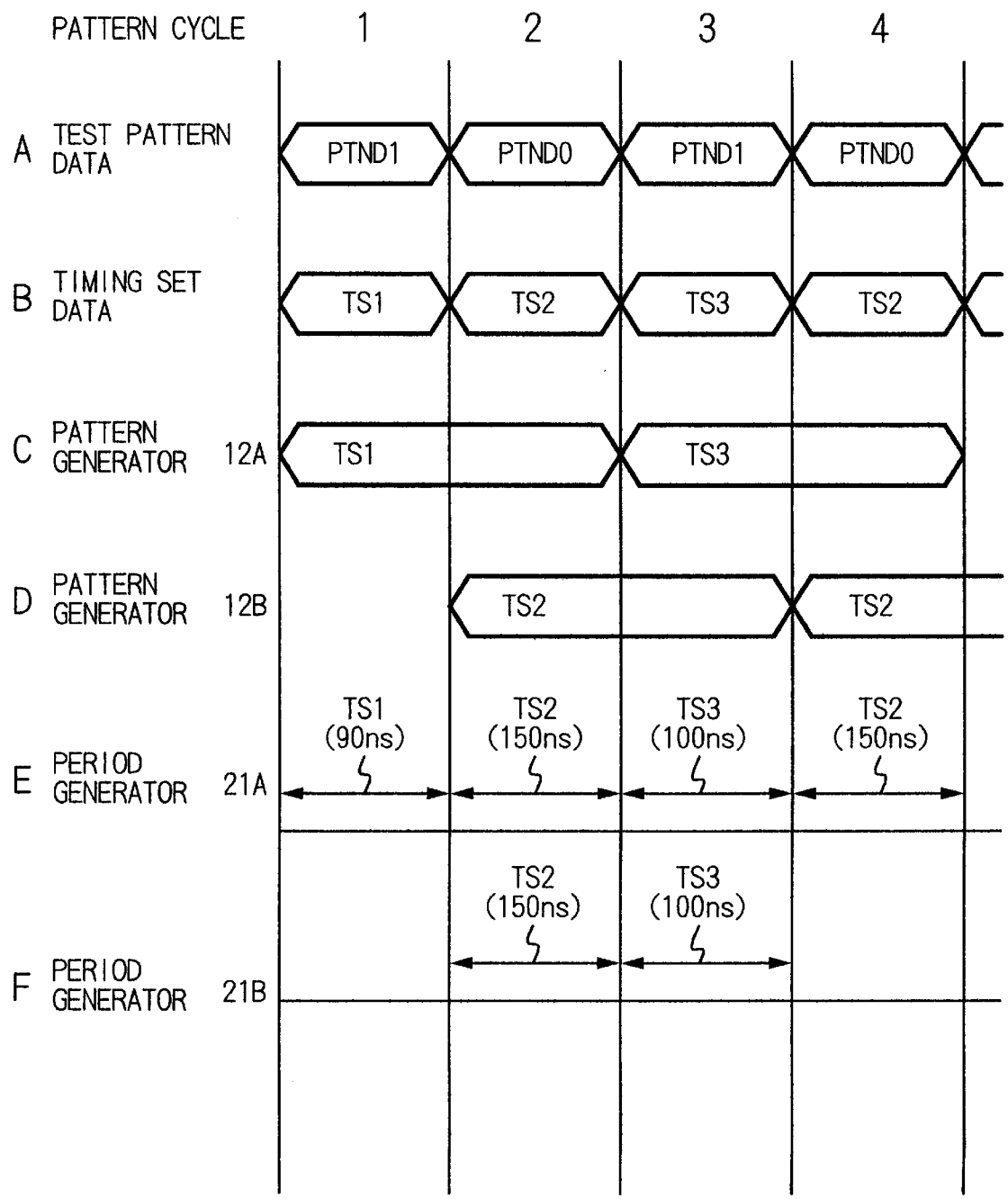
FIG. 11 is a timing chart for further explaining in detail the operation of the timing generator shown in FIG. 8.
Figures 12, 13:
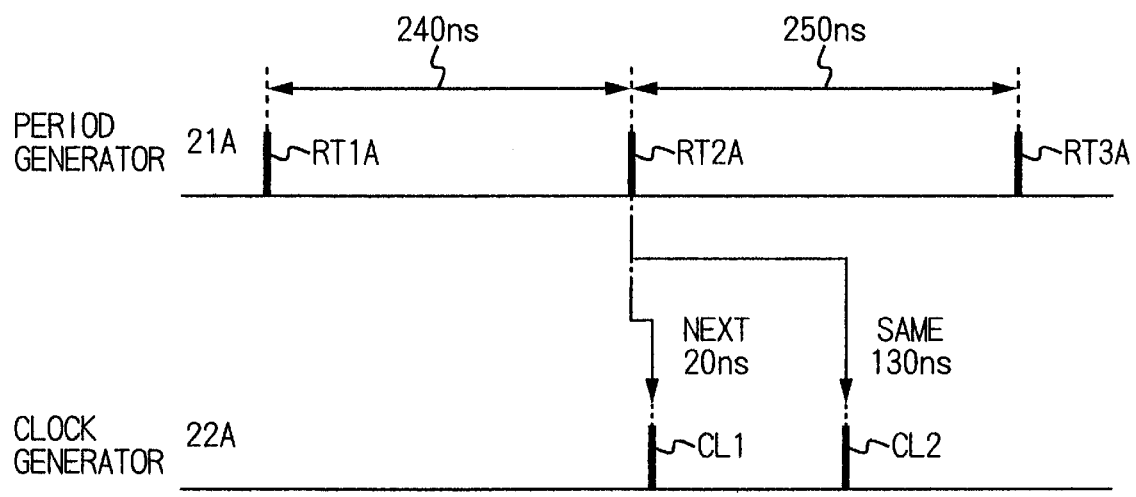
FIG. 12 is a diagram for explaining a drawback of the timing generator shown in FIG. 8.
FIG. 13 is a timing chart for explaining a drawback of the timing generator shown in FIG. 8.

Like the conventional timing generators shown in FIG. 8, a timing generator 13A of one set comprises a period generator 21A, a clock generator 22A including a clock data memory 24A, and a clock data processing circuit 23A, and a timing generator 13B of the other set comprises a period generator 21B, a clock generator 22B including a clock data memory 24B, and a clock data processing circuit 23B.

In the present invention, the clock data processing circuits 23A and 23B of both sets comprise period data memories 23MA and 23MB, subtracters 25A and 25B each having two input terminals A and B, one output terminal and one carry signal output terminal CR, AND gates 26A and 26B each having two input terminals and one output terminal, multiplexers 27A and 27B each having two input terminals A and B, one output terminal and one control terminal S, multipliers 28A and 28B each having one input terminal and one output terminal, switches 30A and 30B selectively turning on/off paths for short-circuiting the multipliers 28A and 28B respectively, and OR gates 29A and 29B each having two input terminals and one output terminal, respectively. That is, in addition to the circuit configurations of the clock data processing circuits 23A and 23B of the conventional timing generators shown in FIG. 8, the multipliers 28A and 28B, the switches 30A and 30B, and the OR gates 29A and 29B are further added.

The input terminals of the multipliers 28A and 28B are connected through the period data memories 23MA and 23MB in series therewith to input terminals T1A and T1B to which period data RATDAT of the timing generators 23A and 23B are supplied, respectively. The output terminals of the multipliers 28A and 28B are connected to the input terminals B of the subtracters 25A and 25B, respectively. In addition, there are provided short circuits for short-circuiting between the input and the output terminals of the multipliers 28A and 28B respectively, and the switches 30A and 30B are inserted in these short circuits respectively.

The switches 30A and 30B are retained off only the case that period data RATDAT read out of the period data memories 23MA and 23MB based on timing set information supplied from the pattern generators 12A and 12B have a constant period in succession, respectively. Accordingly, in that case, the period data multiplied by N by each of the multipliers 28A and 28B is supplied to one input terminal B of each of the subtracters 25A and 25B.

Here, the multiple N of the multipliers 28A and 28B is an integer of 2 or greater than 2 equal to the number in total of clock generators used in generating a test pattern signal in multiple way (N way) system. In the illustrated example, two clock generators 22A and 22B are used and hence N is 2.

Consequently, the period data RATDAT read out of the period data memories 23MA and 23MB are multiplied by N by the multipliers 28A and 28B to be supplied to the one input terminals B of the subtracters 25A and 25B respectively, or alternatively are passed by the multipliers 28A and 28B to be directly supplied to the one input terminals B of the subtracters 25A and 25B respectively.

On previously setting data (clock data and flags) in the clock data memories 24A and 24B of the clock generators 22A and 22B, clock data CLDAT supplied from the main controller are inputted to input terminals T2A and T2B of the timing generators 23A and 23B. The input terminals T2A and T2B are connected, like the conventional timing generators shown in FIG. 8, to the other input terminals A of the subtracters 25A and 25B and the one input terminals A of the multiplexers 27A and 27B, respectively. The output terminals of the subtracters 25A and 25B are connected to the other input terminals B of the multiplexers 27A and 27B respectively, the carry signal output terminals CR of which are connected to the one input terminals of the AND gates 26A and 26B, respectively. The output terminals of the AND gates 26A and 26B are connected to the control terminals S of the multiplexers 27A and 27B and the clock data memories 24A and 24B, respectively, and the output terminals of the multiplexers 27A and 27B are connected to the clock data memories 24A and 24B, respectively.

In this embodiment, the output terminals of the OR gates 29A and 29B are connected to the other input terminals of the AND gates 26A and 26B, respectively, and to the one input terminals of the OR gates 29A and 29B are connected, like the conventional timing generators shown in FIG. 8, mode setting terminals MTA1 and MTB1 to which a logical H signal is supplied in the case of one way mode and a logical L signal is supplied in the case of two way mode, respectively.

Moreover, second mode setting terminals MTA2 and MTB2 are connected to the other input terminals of the OR gates 29A and 29B, respectively. A logical H signal is supplied to the second mode setting terminals MTA2 and MTB2 even in two way mode, if period data RATDAT have a constant value in succession. During a logical H signal is being supplied to the second mode setting terminals MTA2 and MTB2, the switches 30A and 30B are retained off.

The subtracters 25A and 25B subtract data supplied to their input terminals A from data supplied to their input terminals B (B−A). In this embodiment, as described above, only the case that period data RATDAT read out of the period data memories 23MA and 23MB have a constant period in succession respectively, the switches 30A and 30B are retained off, and hence, at that case, the period data multiplied by 2 by the multipliers 28A and 28B are supplied to the one input terminals B of the subtracters 25A and 25B, respectively. In other cases, the switches 30A and 30B are retained on, and hence the period data pass through the short circuits and are directly supplied to the one input terminals B of the subtracters 25A and 25B, respectively. As a result, the subtracters 25A and 25B subtract the clock data CLDAT from the period data RATDAT multiplied by 2 by the multipliers 28A and 28B or the period data RATDAT which do not pass through the multipliers 28A and 28B and have values not multiplied (B−A).

Now, the operation of the timing generators configured as above will be described.

Figure 4:
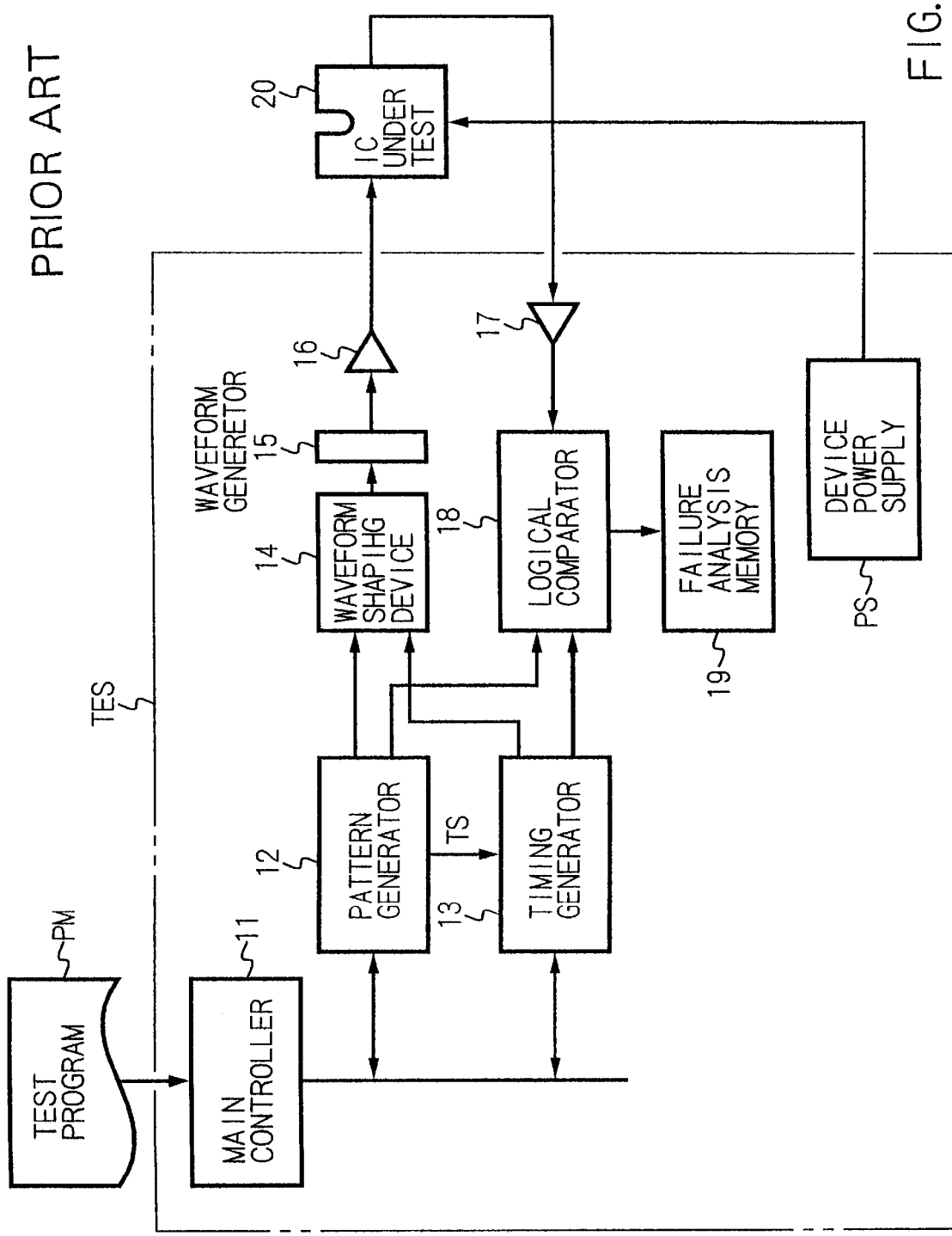
FIG. 4 is a block diagram for explaining the general construction of a conventional IC tester.
Figure 5:
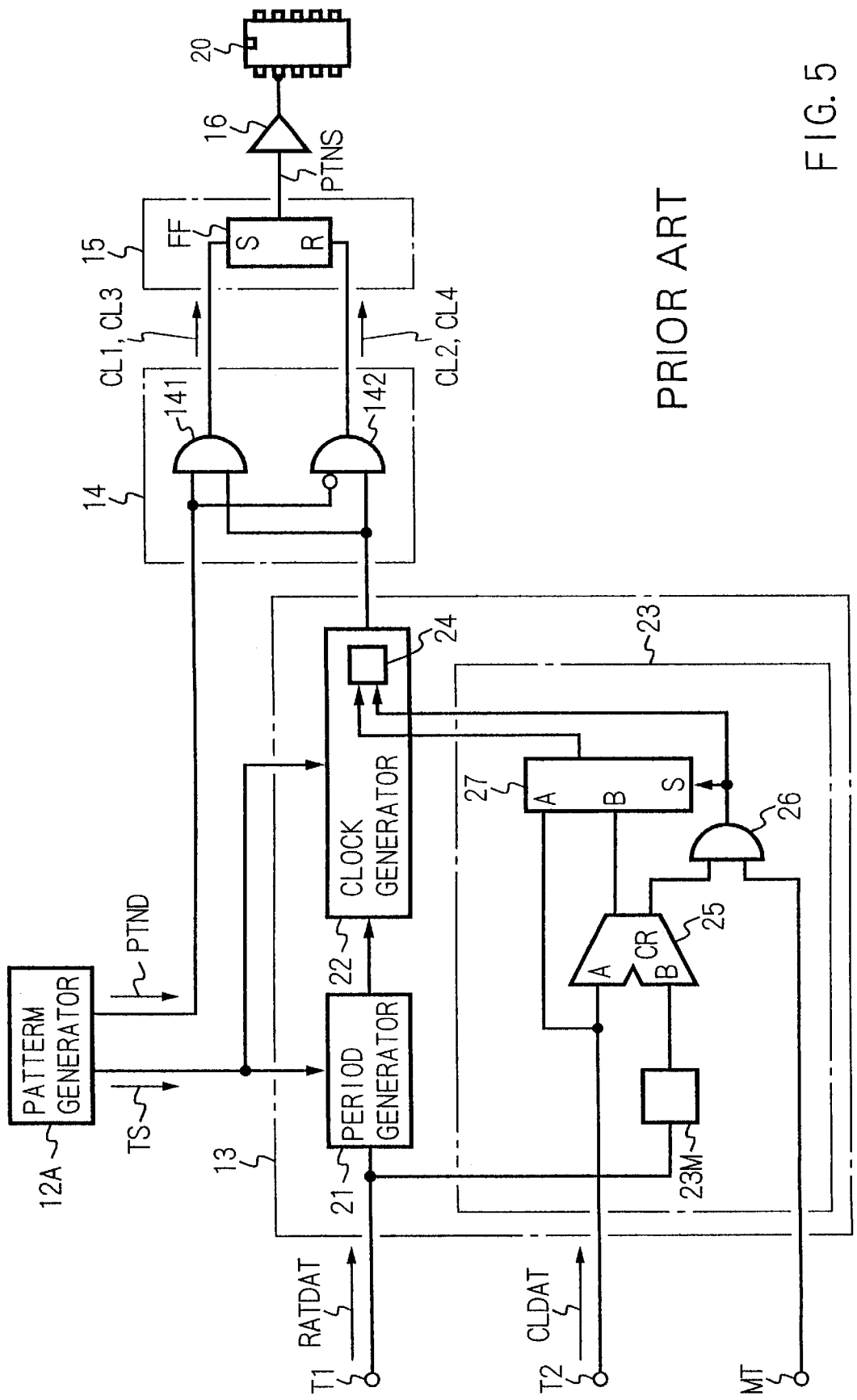
FIG. 5 is a block diagram showing a circuit configuration of the conventional timing generator, together with a pattern generator, a waveform shaping device and a waveform generator.
Figures 6, 7:
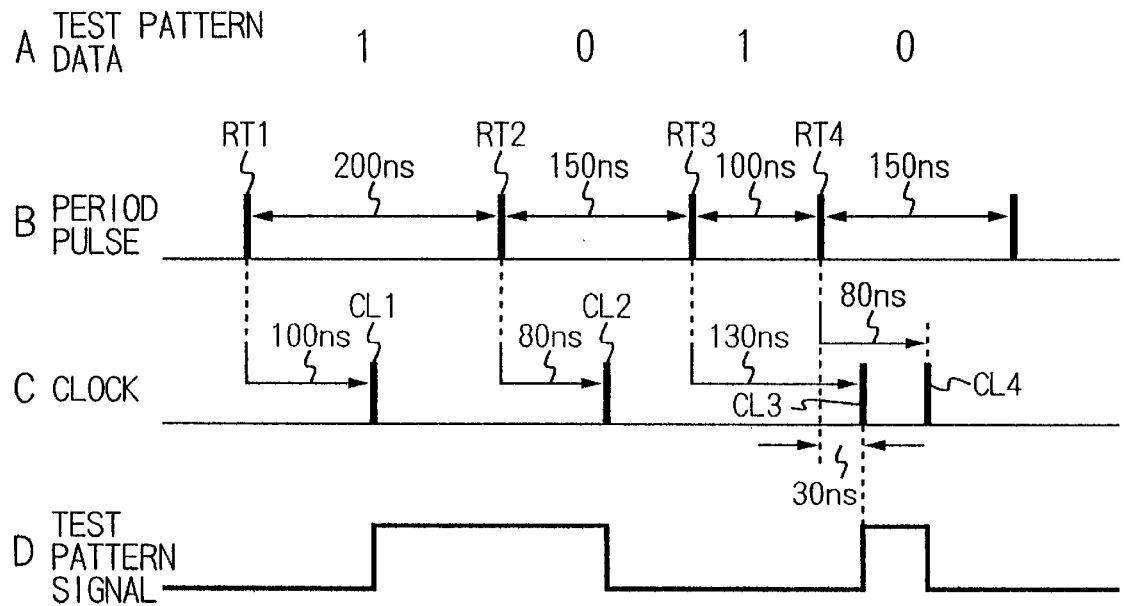
FIG. 6 is a timing chart for explaining the operation of the timing generator shown in FIG. 5.
FIG. 7 is a diagram showing an example of corresponding relationship between timing set information given to the timing generator shown in FIG. 5, and previously set period data and clock data supplied from a main controller, and the contents of a clock data memory previously set, respectively.

Like the conventional timing generators, in the case of operating the timing generators in two way system, a logical L signal 2WAY(L) is supplied from the main controller (see FIG. 4) to the mode setting terminals MTA1 and MTB1, respectively. This logical L signal 2WAY(L) pass through the OR gates 29A and 29B to the other input terminals of the AND gates 26A and 26B respectively which are in turn always maintained in disable state, and hence, even if a logical H signal occurs at the carry signal output terminals CR of the subtracters 25A and 25B, this logical H signal cannot be passed through the AND gates 26A and 26B.

When the logical L signal 2WAY(L) is being supplied to the mode setting terminals MTA1 and MTB1, the switches 30A and 30B are retained on. As a result, the period data read out of the period data memories 23MA and 23MB do not pass through the multipliers 28A and 28B and are directly supplied to the input terminals B of the subtracters 25A and 25B.

On the other hand, in the case of operating the timing generators in one way system, a logical H signal 1WAY(H) is supplied from the main controller to the mode setting terminals MTA1 and MTB1, respectively. As a result, the AND gates 26A and 26B are always maintained in enable state. Accordingly, when a logical H signal occurs at each of the carry signal output terminals CR of the subtracters 25A and 25B, this logical H signal passes through the AND gates 26A and 26B to the control terminals S of the multiplexers 27A and 27B and the clock data memories 24A and 24B, respectively.

When the logical H signal 1WAY(H) is being supplied to the mode setting terminals MTA1 and MTB1, the switches 30A and 30B are also retained on. As a result, the period data read out of the period data memories 23MA and 23MB do not pass through the multipliers 28A and 28B and are directly supplied to the input terminals B of the subtracters 25A and 25B.

On previously setting data in the clock data memories 24A and 24B of the clock generators 22A and 22B, timing set information TS is supplied from the pattern generators 12A and 12B to the clock data processing circuits 23A and 23B, and substantially at the same time, clock data CLDAT is given from the main controller to the input terminals T2A and T2B of the timing generators 13A and 13B, respectively. As a result, the clock data CLDAT is given to the input terminals A of the subtracters 25A and 25B and to the input terminals A of the multiplexers 27A and 27B, respectively. On the other hand, the period data RATDAT read out of the period data memories 23MA and 23MB of the clock data processing circuits 23A and 23B based on the timing set information TS are supplied to the input terminals B of the subtracters 25A and 25B respectively after they are multiplied by 2 by the multipliers 28A and 28B or pass through the short circuits of the multipliers 28A and 28B.

Figures 2, 3:
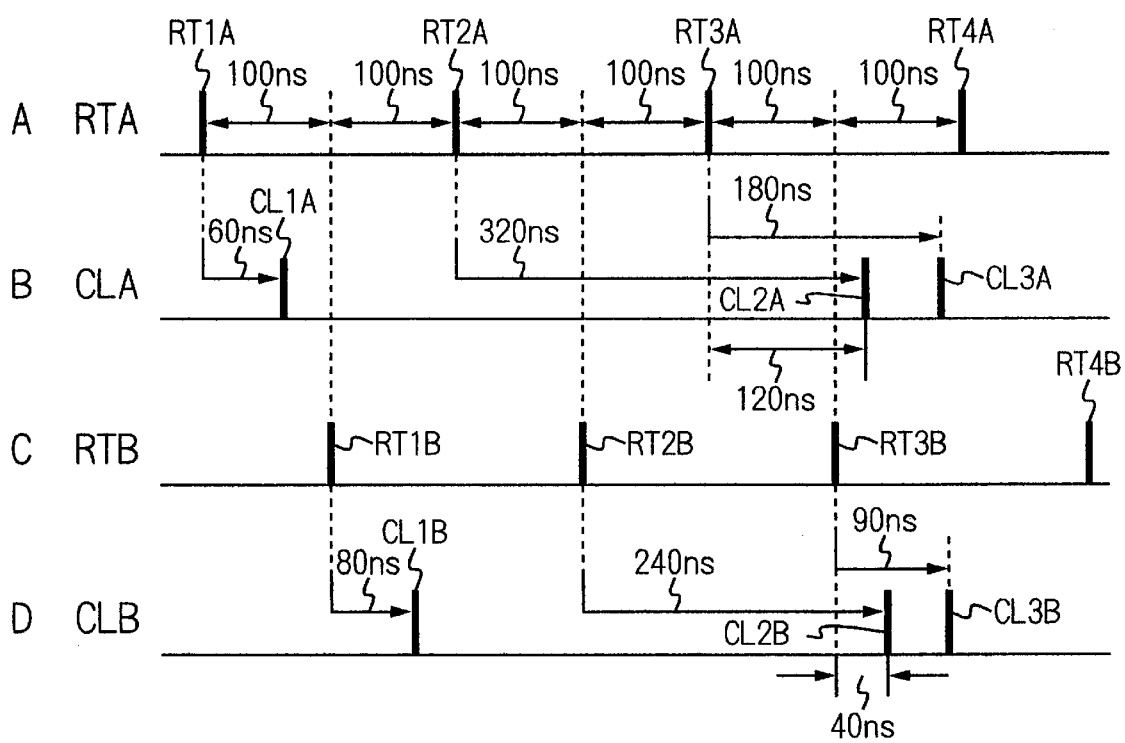
FIG. 2 is a diagram showing an example of corresponding relationship between timing set information given to the timing generator shown in FIG. 1, and previously set period data and clock data supplied from a main controller, and the contents of a clock data memory previously set, respectively.
FIG. 3 is a timing chart for explaining the operation of the timing generator shown in FIG. 1.

It is assumed that values of period data RATDAT previously set in the period data memories 23MA and 23MB and values of clock data CLDAT supplied from the main controller, which correspond to timing set information TS generated from the pattern generators 12A and 12B are as shown in FIG. 2. That is, it is assumed that the timing set information TS1 corresponds to that the period data RATDAT is 100 ns and the clock data CLDAT is 60 ns, the timing set information TS1 corresponds to that the period data RATDAT is 100 ns and the clock data is 80 ns, the timing set information TS3 corresponds to that the period data RATDAT is 100 ns and the clock data is 320 ns, the timing set information TS4 corresponds to that the period data RATDAT is 100 ns and the clock data is 240 ns, the timing set information TS5 corresponds to that the period data RATDAT is 100 ns and the clock data is 180 ns, and the timing set information TS6 corresponds to that the period data RATDAT is 100 ns and the clock data is 90 ns.

Also, it is assumed that the timing set information TS is supplied in order of TS1, TS2, TS3, TS4, TS5, TS6, . . . (TS1→TS2→TS3→TS4→TS5→TS6 . . . ).

In this case, since period data read out of the period data memories 23MA and 23MB of the clock data processing circuits 23A and 23B have the same constant period with each other, a logical H signal RATFIX(H) is supplied from the main controller 11 to the second mode setting terminals MTA2 and MTB2 and the switches 30A and 30B are held off, respectively.

Since it is two way system, test pattern data PTND and timing set information TS are generated in alternate cycles from the pattern generators 12A and 12B of respective sets, and the timing set information TS is supplied to the corresponding timing generators 13A and 13B. Moreover, the period generators 21A and 21B of respective sets are arranged such that they can transmit and receive timing set information TS therebetween.

In such case, timing set data TS generated from both the pattern generators 12A and 12B are as TS1+TS2, TS2+TS3, TS3+TS4, TS4+TS5, TS5+TS6, . . . . Since the period generators 21A and 21B are arranged such that they can transmit and receive timing set information TS between them, the period generator 21A sequentially generates period pulses RTA, as shown in FIG. 3A, with a period of TS1+TS2, a period of TS3+TS4, a period of TS5+TS6, . . . , and the period generator 21B sequentially generates period pulses RTB, as shown in FIG. 3C, with a period of TS1+ TS2, a period of TS3+TS4, a period of TS5+TS6, . . . , starting at a timing point delayed by the period of TS1 from the period generator 21A.

Explaining further in detail, the period generator 21A sequentially generates period pulses RT1A with a period of 200 ns (100 ns+100 ns), RT2A with a period of 200 ns (100 ns+100 ns), RT3A with a period of 200 ns (100 ns+100 ns), RT4A with a period of 200 ns (100 ns+100 ns), . . . , and the period generator 21B sequentially generates period pulses RT1B with a period of 200 ns (100 ns+100 ns), RT2B with a period of 200 ns (100 ns+100 ns), RT3B with a period of 200 ns (100 ns+100 ns), . . . , starting at a timing point delayed by a period of 100 ns (TS1) from the period generator 21A.

Both the clock generators 22A and 22B delay the period pulses RTA and RTB respectively supplied from the preceding period generators 21A and 21B based on clock data and a flag (SAME or NEXT) previously set in the clock data memories 24A and 24B, thereby to generate clock pulses CLA and CLB shown in FIGS. 3B and 3D, respectively.

In the two way system, the two period generators 21A and 21B alternately output therefrom the period pulses RTA and RTB at intervals of the sum of values of two period data corresponding to two timing set informations specified by a program, the intervals being defined as periods of the period generators 21A and 21B, respectively.

In the first cycle associated with the period pulse RT1A, since the period data of 100 ns is greater than the clock data of 60 ns, a logical L is outputted from the carry signal output terminal CR of the subtracter 25A. As a result, the clock data of 60 ns is directly stored in the clock data memory 24A as it is (namely, as 60 ns ), and concurrently therewith, a same flag SAME representing that a clock pulse is to be generated within the same period is stored in the clock data memory 24A.

In the second cycle associated with the period pulse RT1B, since the period data of 100 ns is greater than the clock data of 80 ns, a logical L is also outputted from the carry signal output terminal CR of the subtracter 25B. As a result, the clock data of 80 ns is directly stored in the clock data memory 24B as it is (namely, as 80 ns), and concurrently therewith, a same flag SAME representing that a clock pulse is to be generated within the same period is stored in the clock data memory 24B.

In the third cycle associated with the period pulse RT2A, since a value of twice the period data of 100 ns is smaller than the clock data of 320 ns (the period of this third cycle is 200 ns (TS3+TS4) which is twice this period data of 100 ns), a logical H is outputted from the carry signal output terminal CR of the subtracter 25A.

As described above, each of the period data has always the same value of 100 ns, in other words, a plurality of the period data each having the same value are in succession, and hence a logical H signal RATFIX(H) is being supplied to the second mode setting terminals MTA2 and MTB2 so that the switches 30A and 30B are in off state, respectively. Consequently, the logical H signal RATFIX(H) passes through the OR gate 29A to the other input terminal of the AND gate 26A which is in turn maintained in enable state.

The subtracter 25A operates to subtract 320 ns from (100 ns×2). Since the result of the subtraction is −120 ns, the subtracter 25A outputs a carry signal of logical H from its carry signal output terminal CR. The AND gate 26A is retained in enable state, and hence this logical H signal passes through the AND gate 26A to the control terminal S of the multiplexer 27A. Since the multiplexer 27A selects its input terminal B when a logical H is applied to its control terminal S, the absolute value of the subtraction result or value (−120 ns) of the subtracter 25A is supplied to the clock data memory 24A. At the same time, the logical H signal is also supplied to the clock data memory 24A. As a result, the clock data memory 24A stores therein the absolute value (120 ns) of the subtraction result of the subtracter 25A and a next flag NEXT representing that a clock pulse is to be generated in the next cycle.

In the fourth cycle associated with the period pulse RT2B, since a value of twice the period data of 100 ns is smaller than the clock data of 240 ns (the period of this fourth cycle is 200 ns (TS4+TS5) which is twice this period data of 100 ns), a logical H is outputted from the carry signal output terminal CR of the subtracter 25B. Accordingly, a logical H signal RATFIX(H) passes through the OR gate 29B to the other input terminal of the AND gate 26B which is in turn maintained in enable state.

The subtracter 25B operates to subtract 240 ns from (100 ns×2). Since the result of the subtraction is −40 ns, the subtracter 25B outputs a carry signal of logical H from its carry signal output terminal CR. The AND gate 26B is retained in enable state, and hence this logical H signal passes through the AND gate 26B to the control terminal 8 of the multiplexer 27B. Since the multiplexer 27B selects its input terminal B when a logical H is applied to its control terminal S, the absolute value of the subtraction result (−40 ns) of the subtracter 25B is supplied to the clock data memory 24B. At the same time, the logical H signal is also supplied to the clock data memory 24B. As a result, the clock data memory 24B stores therein the absolute value (40 ns) of the subtraction result of the subtracter 25B and a next flag NEXT representing that a clock pulse is to be generated in the next cycle.

In the fifth cycle associated with the period pulse RT3A, since the period data of 100 ns is greater than the clock data of 180 ns (the period of this fifth cycle is 200 ns (TS5+TS6) which is twice this period data of 100 ns), a logical L is outputted from the carry signal output terminal CR of the subtracter 25A. As a result, the clock data of 180 ns is directly stored in the clock data memory 24A as it is (namely, as 180 ns), and concurrently therewith, a same flag SAME representing that a clock pulse is to be generated within the same period is stored in the clock data memory 24A.

In the sixth cycle associated with the period pulse RT3B, since the period data of 100 ns is greater than the clock data of 90 ns, a logical L is outputted from the carry signal output terminal CR of the subtracter 25B. As a result, the clock data of 90 ns is directly stored in the clock data memory 24B as it is (namely, as 90 ns), and concurrently therewith, a same flag SAME representing that a clock pulse is to be generated within the same period is stored in the clock data memory 24B.

In such manner, when a plurality of period data read out of the period data memories 23MA and 23MB of the clock data processing circuits 23A and 23B based on the timing set information are ones each having the same period with one another in succession, a logical H signal RATFIX(H) is automatically supplied from the main controller to the second mode setting terminals MTA2 and MTB2 so that the switches 30A and 30B are maintained in off state. As a result, it is possible that if each of the period data is multiplied by 2 by the multipliers 28A or 28B and the result of subtraction in which the clock data is subtracted from twice the period data is negative (−), a next flag NEXT outputted from each of the subtracters 25A and 25B is stored in the corresponding one of the clock data memories 24A and 24B of the clock generators 22A and 22B. Thus, flags and clock data shown in the right side two columns of FIG. 2 are previously set in the both of the clock data memories 24A and 24B.

From the flags and clock data shown in the right side two columns of FIG. 2, the clock generator 22A of the one set generates a clock pulse CL1A at a timing delayed by 60 ns from the first cycle pulse RT1A and within the same cycle, a clock pulse CL2A at a timing delayed by 320 ns from the third cycle pulse RT2A and within the next cycle, a clock pulse CL3A at a timing delayed by 180 ns from the fifth cycle pulse RT3A and within the same cycle, as shown in FIG. 3B.

On the other hand, the clock generator 22B of the other set generates a clock pulse CL1B at a timing delayed by 80 ns from the second cycle pulse RT1B and within the same cycle, a clock pulse CL2B at a timing delayed by 240 ns from the fourth cycle pulse RT2B and within the next cycle, a clock pulse CL3 B at a timing delayed by 90 ns from the sixth cycle pulse RT3B and within the same cycle, as shown in FIG. 3D.

Accordingly, even in the case of generating test pattern signals in two way system, it is possible to generate a clock in the next cycle, and in the case a user creates a program, it is unnecessary that an attention is paid such that clock data has its value which is not beyond the next cycle. In addition, when two or more of period data each having the same period with one another are in succession, a logical H signal is automatically supplied to the second mode setting terminals MTA and MTB, and also the switches 30A and 30B are maintained in off state. Therefore, it is possible that a next flag NEXT representing that a clock pulse is to be generated within the next cycle is stored in the clock data memories 24A and 24B. Thus, even in the case of operating the timing generator in two way system, like the case of operating the timing generator in one way system, a next flag "NEXT" can be stored in the clock data memories 24A and 24B, and hence it can be also conducted without producing any problems to test and measure memory ICs each of which performs all of its operations in synchronism with clocks each having a constant period, such as synchronous type memory ICs.

Further, in FIG. 2, though all of the period data in the period data memories 23MA and 23MB corresponding to the timing set information TS have a value of 100 ns, period data having various lengths or intervals (ns) are previously set therein in practice, and a user selects desired period data from them by a program. Since the sequence of occurrences of timing set information TS is specified by a user using a program, there are many sequences.

In the above-mentioned embodiment, the case of operating the timing generator in the two way system has been described by way of example. However, it goes without saying that the present invention is not limited to such case of generating test pattern signals in the two way system and can likewise be applied to a timing generator used in case of generating test pattern signals in other multiple way systems (three way system, four way system, . . . ). In such cases, it is needless to say that the multiple N of each of the multipliers 28A and 28B is selected to be equal to the total number of clock generators used in that multiple way system (for example, in the case of four way system, N is 4).

In addition, it is much possibility that in the case a plurality of period data each having the same period with one another are in succession, if any clock data representing that a clock pulse is to be generated within a subsequent cycle later than 2N times the period (the cycle after the next cycle) should be stored in the clock data memories, an erroneous operation will occur, and hence it is necessary to pay an attention so as to not program such clock data.

As is apparent from the foregoing, in accordance with the present invention, it is arranged that there is provided a multiplier for multiplying any period data by N, and only when N or more period data each having the same period of a constant value with one another are in succession, each of the period data multiplied by N by the multiplier is supplied to one input terminal of a subtracter in which clock data supplied to the other input terminal thereof from the main controller is subtracted from the N times the period data, and the result of the subtraction and a signal from the carry signal output terminal of the subtracter can be sent to a clock data memory. Therefore, when a next flag representing that a clock is to be generated within the next cycle is outputted from the carry signal output terminal of the subtracter, this next flag can be stored in the clock data memory. As a result, even in the case of generating test pattern signals in N way system, a clock delayed until the next cycle can be generated.

Accordingly, there is obtained a remarkable advantage that even either ICs each of which outputs, for example, data to which a read instruction has been given, after the cycle has advanced from the cycle including the timing at which the read instruction has been given to the next cycle or memory ICs each of which performs all of its operations in synchronism with clocks each having a constant period, such as synchronous type memory ICs, can be tested and measured using a timing generator used in the case of generating test pattern signals in N way system.

What is claimed is:

1. A timing generator means comprising a plurality of N timing generators, N being an integer of 2 or greater than 2, each of the N timing generators including a clock generator, a period generator and a clock data processing circuit, said timing generator means being arranged such that a timing of generation of a clock outputted from each of said clock generators is controlled based on data previously set in a memory provided in each of said clock generators, thereby to generate a clock at a desired timing from each of the clock generators, each of said clock data processing circuits including:

a multiplier for multiplying by N a value of period data read out of period data memory of the associated clock data processing circuit; and a subtracter for performing a subtraction between the period data multiplied by N by said multiplier or the period data read out of the period data memory and clock data supplied from the outside, said timing generator means further including:

means for supplying, only in the case that N or more period data are in succession, the period of each of said period data being a constant, period data read out of said period data memory to each of said multipliers to multiply the period data by N, thereby providing a control signal to each of said clock data processing circuits, said control signal enabling a subtraction value outputted from an output terminal of each of said subtracters and a next flag outputted from a carry signal output terminal of each of said subtracters when a value of the clock data is greater than that of the period data multiplied by N to be stored in the memory of each of said clock generators, said next flag representing that a clock is to be generated in the next cycle, and whereby in the case of operating each timing generator in N way system, when clock data for generating a clock at a desired timing point in the next cycle is supplied together with period data read out of the associated period data memory, a next flag outputted from the carry signal output terminal of the associated subtracter and the subtraction value outputted from the output terminal of the associated subtracter can be stored in the memory of the associated clock generator.

2. The timing generator means according to claim 1, wherein the period data memory of each of said clock data processing circuits has various kinds of period data previously set from a main controller, each of said subtracters performs a subtraction between period data read out of the associated period data memory or period data multiplied by N by the associated multiplier and clock data supplied from the main controller, and said next flag is outputted from the carry signal output terminal of the associated subtracter when a value of the clock data is greater than that of the period data multiplied by N.

3. The timing generator means according to claim 1, wherein there are provided short circuits each for bypassing the associated multiplier of said multipliers, and switching means each for turning on/off the associated short circuit of said short circuits, and wherein only in the case that N or more period data are in succession, the period of each of said period data being a constant, each of said switching means turns off the associated short circuit.

4. The timing generator means according to claim 1, wherein based on timing set information supplied from a pattern generator to the associated clock data processing circuit of said clock data processing circuits, period data is read out of the period data memory of the associated clock data processing circuit, said period data corresponding to the timing set information.

5. A timing generator means comprising a plurality of N timing generators, N being an integer of 2 or greater than 2, each of the N timing generators including a clock generator, a period generator and a clock data processing circuit, said timing generator means being used in a semiconductor device testing apparatus which is arranged such that a timing of generation of a clock outputted from each of said clock generators is controlled based on data previously set in a memory provided in each of said clock generators, thereby to generate a clock at a desired timing from each of the clock generators, and the clock pulses thus generated are multiplexed to produce a test pattern signal for testing a semiconductor device using the multiplexed clock pulses, the clock data processing circuit of each of said N timing generators including:

a multiplier supplied with period data read out of period data memory of the associated clock data processing circuit, for multiplying a value of the supplied period data by N;

a subtracter having one input terminal supplied with the period data multiplied by N by said multiplier or the period data read out of the period data memory, and performing a subtraction between the period data multiplied by N and clock data supplied to the other input terminal of said subtracter from the outside;

selecting means for selecting one of the clock data supplied to said subtracter and a subtraction value outputted from an output terminal of said subtracter to output it to a memory provided in the associated clock generator;

first control means for controlling said selecting means so as to select the clock data supplied to said subtracter when a value of clock data is smaller than that of period data, thereby preventing a subtraction value outputted from the output terminal of said subtracter from being stored in the memory of the associated clock generator; and second control means for supplying, only in the case that N or more period data are in succession, the period of each of said period data being a constant, period data read out of said period data memory to the associated multiplier to multiply the period data by N, thereby enabling the subtraction value outputted from the output terminal of the associated subtracter and a next flag outputted from a carry signal output terminal of the associated subtracter to be stored in the memory of the associated clock generator, said next flag representing that a clock is to be generated in the next cycle, and whereby in the case of operating each timing generator in N way system, when clock data for generating a clock at a desired timing point in the next cycle is supplied together with period data read out of the associated period data memory, a next flag outputted from the carry signal output terminal of the associated subtracter and the subtraction value outputted from the output terminal of the associated subtracter can be stored in the memory of the associated clock generator.

6. The timing generator means according to claim 5, wherein said first control means includes a gate having two input terminals and an output terminal one input terminal of which is connected to the carry signal output terminal of the associated subtracter, the other input terminal of which is connected to an inhibit signal supply terminal, and the output terminal of which is connected to a control terminal of the associated selecting means and the memory of the associated clock generator, and wherein in the case of operating each timing generator in N way system, an inhibit signal is supplied to said the other input terminal of said gate through said inhibit signal supply terminal, thereby to prevent said selecting means from selectively outputting the subtraction value outputted from the output terminal of the associated subtracter as well as prevent said gate from passing the next flag outputted from the carry signal output terminal of the associated subtracter therethrough.

7. The timing generator means according to claim 5, wherein said second control means includes a gate having two input terminals and an output terminal one input terminal of which is connected to the carry signal output terminal of the associated subtracter, the other input terminal of which is connected to an enabling signal supply terminal, and the output terminal of which is connected to a control terminal of the associated selecting means and the memory of the associated clock generator, and wherein only in the case that N or more period data are in succession, the period of each of said period data being a constant, an enabling signal is supplied to said the other input terminal of said gate through said enabling signal supply terminal, thereby to enable said selecting means to selectively output the subtraction value outputted from the output terminal of the associated subtracter as well as enable said gate to pass the next flag outputted from the carry signal output terminal of the associated subtracter therethrough.

8. The timing generator means according to claim 5, wherein said first control means and said second control means use a gate in common, said gate having two input terminals and an output terminal one input terminal of which is connected to the carry signal output terminal of the associated subtracter, the other input terminal of which is connected to an inhibit signal supply terminal and an enabling signal supply terminal, and the output terminal of which is connected to a control terminal of the associated selecting means and the memory of the associated clock generator, and wherein in the case of operating each timing generator in N way system, an inhibit signal is supplied to said the other input terminal of said gate through said inhibit signal supply terminal, thereby to prevent said selecting means from selectively outputting the subtraction value outputted from the output terminal of the associated subtracter as well as prevent said gate from passing the next flag outputted from the carry signal output terminal of the associated subtracter therethrough, and only in the case that N or more period data are in succession, the period of each of said period data being a constant, an enabling signal is supplied to said the other input terminal of said gate through said enabling signal supply terminal, thereby to enable said selecting means to selectively output the subtraction value outputted from the output terminal of the associated subtracter as well as enable said gate to pass the next flag outputted from the carry signal output terminal of the associated subtracter therethrough.

9. The timing generator means according to claim 5, wherein said inhibit signal supply terminal and said enabling signal supply terminal are connected to said the other input terminal of said gate through an OR gate.

10. The timing generator means according to claim 8, wherein said gate used in common by said first control means and said second control means is an AND gate, and wherein said subtracter subtracts the clock data from the period data multiplied by N only in the case that N or more period data are in succession, the period of each of said period data being a constant, and when the result of the subtraction is a negative (minus) value, a next flag of logical H is outputted from the carry signal output terminal, and wherein an inhibit signal of logical L is supplied to said inhibit signal supply terminal, and an enabling signal of logical H is supplied to said enabling signal supply terminal.

11. The timing generator means according to claim 5, wherein the period data memory of each of said clock data processing circuits has various kinds of period date previously set from a main controller, each of said subtracters performs a subtraction between period data read out of the associated period data memory or period data multiplied by N by the associated multiplier and clock data supplied from the main controller, and said next flag is outputted from the carry signal output terminal of the associated subtracter when a value of the clock data is greater than that of the period data multiplied by N.

12. The timing generator means according to claim 5, wherein there are provided short circuits each for bypassing the associated multiplier of said multipliers, and switching means each for turning on/off the associated short circuit of said short circuits, and wherein only in the case that N or more period data are in succession, the period of each of said period data being a constant, each of said switching means turns off the associated short circuit.

13. The timing generator means according to claim 5, wherein based on timing set information supplied from a pattern generator to the associated clock data processing circuit of said clock data processing circuits, period data is read out of the period data memory of the associated clock data processing circuit, said period data corresponding to the timing set information.

* * * * *